US009673235B2

United States Patent
Yanagita et al.

(10) Patent No.: US 9,673,235 B2
(45) Date of Patent: Jun. 6, 2017

(54) SOLID-STATE IMAGING DEVICE, MANUFACTURING METHOD OF SOLID-STATE IMAGING DEVICE, AND ELECTRONIC DEVICE

(71) Applicant: SONY CORPORATION, Tokyo (JP)

(72) Inventors: Takeshi Yanagita, Tokyo (JP); Itaru Oshiyama, Kanagawa (JP); Takayuki Enomoto, Kanagawa (JP); Harumi Ikeda, Kanagawa (JP); Shinichiro Izawa, Kanagawa (JP); Atsuhiko Yamamoto, Kanagawa (JP); Kazunobu Ota, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/084,287

(22) Filed: Mar. 29, 2016

(65) Prior Publication Data

US 2016/0211288 A1    Jul. 21, 2016

Related U.S. Application Data

(63) Continuation of application No. 14/001,652, filed as application No. PCT/JP2012/054390 on Feb. 23, 2012, now Pat. No. 9,502,450.

(30) Foreign Application Priority Data

Mar. 2, 2011   (JP) .................................. 2011-045269
Jan. 23, 2012  (JP) .................................. 2012-011405

(51) Int. Cl.
    *H01L 27/146* (2006.01)
(52) U.S. Cl.
    CPC ........ *H01L 27/146* (2013.01); *H01L 27/1461* (2013.01); *H01L 27/1463* (2013.01);
    (Continued)

(58) Field of Classification Search
    None
    See application file for complete search history.

(56) References Cited

U.S. PATENT DOCUMENTS

| 2005/0184353 A1 | 8/2005 | Mouli |
| 2006/0081890 A1* | 4/2006 | Kang ................ H01L 27/14623 257/233 |

(Continued)

FOREIGN PATENT DOCUMENTS

| JP | H04-280677 | 10/1992 |
| JP | 2005-251947 | 9/2005 |

(Continued)

OTHER PUBLICATIONS

Official Action (with English translation) for Japanese Patent Application No. 2012-029431 mailed Jan. 5, 2016, 18 pages.

(Continued)

*Primary Examiner* — Johannes P Mondt
(74) *Attorney, Agent, or Firm* — Sheridan Ross P.C.

(57) ABSTRACT

The present technology relates to a solid-state imaging device, manufacturing method of a solid-state imaging device, and an electronic device, which can provide a solid-state imaging device having further improved features such as reduced optical color mixing and the like. Also, an electronic device using the solid-state imaging device thereof is provided. According to a solid-state imaging device having a substrate 12 and multiple photoelectric converters 40 that are formed on the substrate 12, an insulating film 21 forms an embedded element separating unit 19. The element separating unit 19 is configured of an insulating film 20 having a fixed charge that is formed so as to coat the inner wall face of a groove portion 30, within the groove portion 30 which is formed in the depth direction from the light input side of the substrate 12.

22 Claims, 20 Drawing Sheets

(52) U.S. Cl.
CPC .... *H01L 27/1464* (2013.01); *H01L 27/14612* (2013.01); *H01L 27/14621* (2013.01); *H01L 27/14623* (2013.01); *H01L 27/14641* (2013.01); *H01L 27/14689* (2013.01); *H01L 27/1462* (2013.01); *H01L 27/14614* (2013.01); *H01L 27/14625* (2013.01); *H01L 27/14627* (2013.01); *H01L 27/14629* (2013.01); *H01L 27/14636* (2013.01); *H01L 27/14645* (2013.01); *H01L 27/14685* (2013.01)

(56) References Cited

U.S. PATENT DOCUMENTS

| | | | | |
|---|---|---|---|---|
| 2007/0284692 | A1* | 12/2007 | Lee | H01L 21/76232 257/510 |
| 2007/0290241 | A1* | 12/2007 | Adachi | H01L 27/14603 257/292 |
| 2008/0088724 | A1* | 4/2008 | Kudoh | H01L 27/14603 348/300 |
| 2009/0189235 | A1* | 7/2009 | Ikeda | H01L 27/1461 257/432 |
| 2010/0065938 | A1* | 3/2010 | Mabuchi | H01L 27/14603 257/443 |
| 2010/0201834 | A1* | 8/2010 | Maruyama | H01L 27/1464 348/222.1 |
| 2011/0024857 | A1* | 2/2011 | Toumiya | H01L 27/14625 257/432 |

FOREIGN PATENT DOCUMENTS

| | | |
|---|---|---|
| JP | 2008-010544 | 1/2008 |
| JP | 2008-506261 | 2/2008 |
| JP | 2009-522814 | 6/2009 |
| JP | 2009-206356 | 9/2009 |
| JP | 2010-186818 | 8/2010 |
| JP | 2010-225818 | 10/2010 |
| JP | 2011-003860 | 1/2011 |
| JP | 2011-138905 | 7/2011 |
| WO | WO 2005/069377 | 7/2005 |

OTHER PUBLICATIONS

Official Action (with English translation) for Japanese Patent Application No. 2012-029431 mailed Sep. 6, 2016, 16 pages.
Official Action (with English translation) for Korean Patent Application No. 10-2013-7021456 mailed Dec. 2, 2016, 10 pages.

* cited by examiner

PLAN LAYOUT

PLAN LAYOUT

SOLID-STATE IMAGING DEVICE, MANUFACTURING METHOD OF SOLID-STATE IMAGING DEVICE, AND ELECTRONIC DEVICE

CROSS-REFERENCE TO RELATED APPLICATIONS

This application is a continuation of U.S. patent application Ser. No. 14/001,652, filed Aug. 26, 2013, which is a national stage application under 35 U.S.C. 371 and claims the benefit of PCT Application No. PCT/JP2012/054390, filed Feb. 23, 2012, which claims priority to Japanese Patent Application Nos. JP 2011-045269 and JP 2012-011405, filed Mar. 2, 2011 and Jan. 23, 2012, respectively, the entire disclosures of which are hereby incorporated herein by reference.

TECHNICAL FIELD

The present disclosure relates to a back face-projection type solid-state imaging device, a manufacturing method thereof, and an electronic device.

BACKGROUND ART

In recent years, a back face-projection type of solid-state imaging device, which projects light from the opposite side from the side on which a wiring layer is formed on a substrate, has been proposed (reference PTL 1 below). With a back face-projection type of solid-state imaging device, the wiring layer and circuit elements and the like are not formed on the light projection side, so the opening rate of light receiving portions formed on the substrate can be increased, while the incident light is input into the light receiving portions without being reflected off the wiring layer or the like, so improvement to sensitivity is provided.

The solid-state imaging device of PTL 1 provides a light blocking film at pixel borders in order to reduce optical color mixing.

CITATION LIST

Patent Literature

PTL 1: Japanese Unexamined Patent Application Publication No. 2010-186818

SUMMARY OF INVENTION

Technical Problem

In this kind of solid-state imaging device, further property improvements such as reduction in optical color mixing or the like is sought after.

The present disclosure provides a solid-state imaging device having further improved properties of reduction in optical color mixing or the like. Also, an electronic device using the solid-state imaging device thereof is provided.

Solution to Problem

The solid-state imaging device according to a first aspect of the present disclosure provides a substrate and multiple photoelectric converters formed on the substrate. Also, an element separating unit configured with an insulating film having a fixed charge form so as to coat the inner wall face of the groove portion, within the groove portion formed in the depth direction from the light input side of the substrate.

The solid-state imaging device according to a second aspect of the present disclosure has a substrate and multiple photoelectric converters formed on the substrate. Also, a groove portion formed in the depth direction from the light input side on the substrate, and an element separating unit having a film that is provided so as to coat the inner wall face of the groove portion and having a hollow construction, are provided.

A manufacturing method of a solid-state imaging device according to the first aspect of the present disclosure includes a process to form multiple pixels having photoelectric converters on a substrate and a process to form a groove portion of a desired depth in the depth direction from the back face side of the substrate. There is a process to then form an insulating film having a fixed charge on the inner wall face of the groove portion, and to form an element separating unit.

The manufacturing method of the solid-state imaging device according to the second aspect of the present disclosure has a process to form multiple pixels having photoelectric converters on a substrate and a process to form a groove portion of a desired depth in the depth direction from the back face side of the substrate. There is a process to then form an element separating unit by forming a film that is a desired film on the inner wall face of the groove portion so that a hollow portion is formed within the groove portion.

An electronic device of the present disclosure has an optical lens, the solid-state imaging device in which light collected in the optical lens is input, and a signal processing circuit to process the output signal that is output from the solid-state imaging device.

Advantageous Effects of Invention

According to the present disclosure, further improvements can be made to properties such as decreased color mixing or the like in a solid-state imaging device. Also, an electronic device with improved image quality can be obtained by using the solid-state imaging device thereof.

Figure 4:
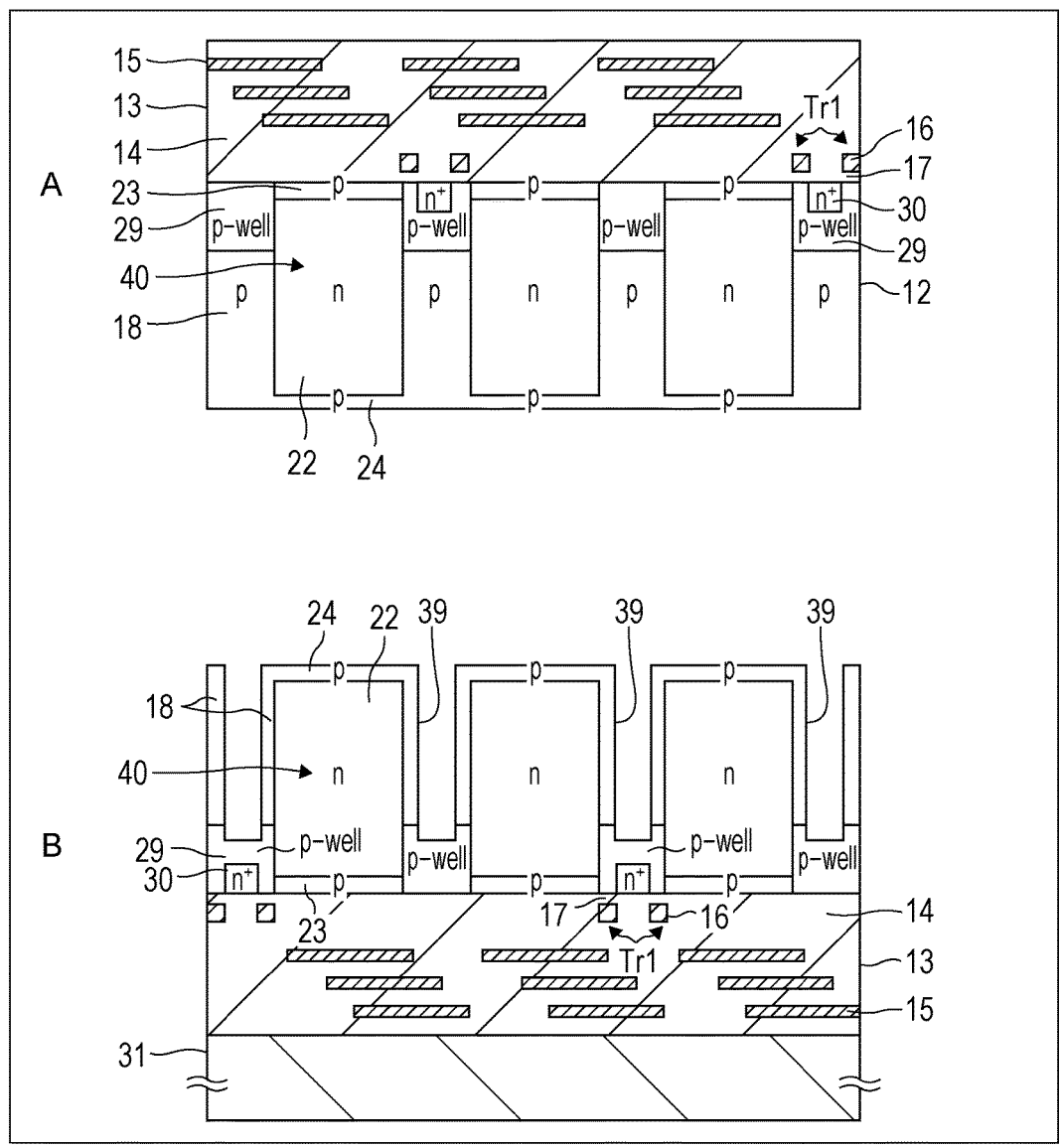

A in FIG. 4 and B in FIG. 4 are diagrams illustrating a manufacturing method of the solid-state imaging device relating to the first embodiment of the present disclosure.

Figure 5:
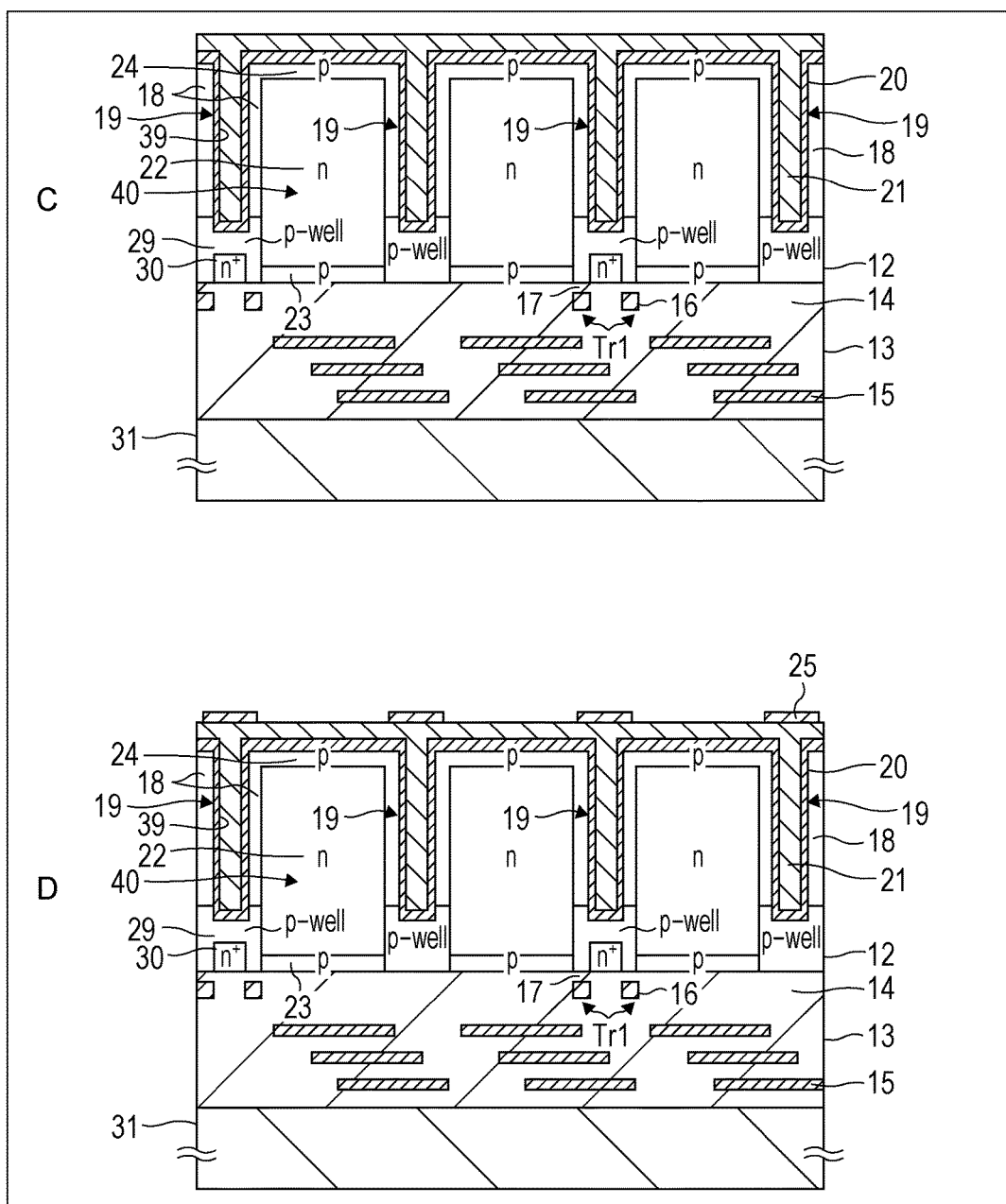

C in FIG. 5 and D in FIG. 5 are diagrams illustrating a manufacturing method of the solid-state imaging device relating to the first embodiment of the present disclosure.

Figure 6:
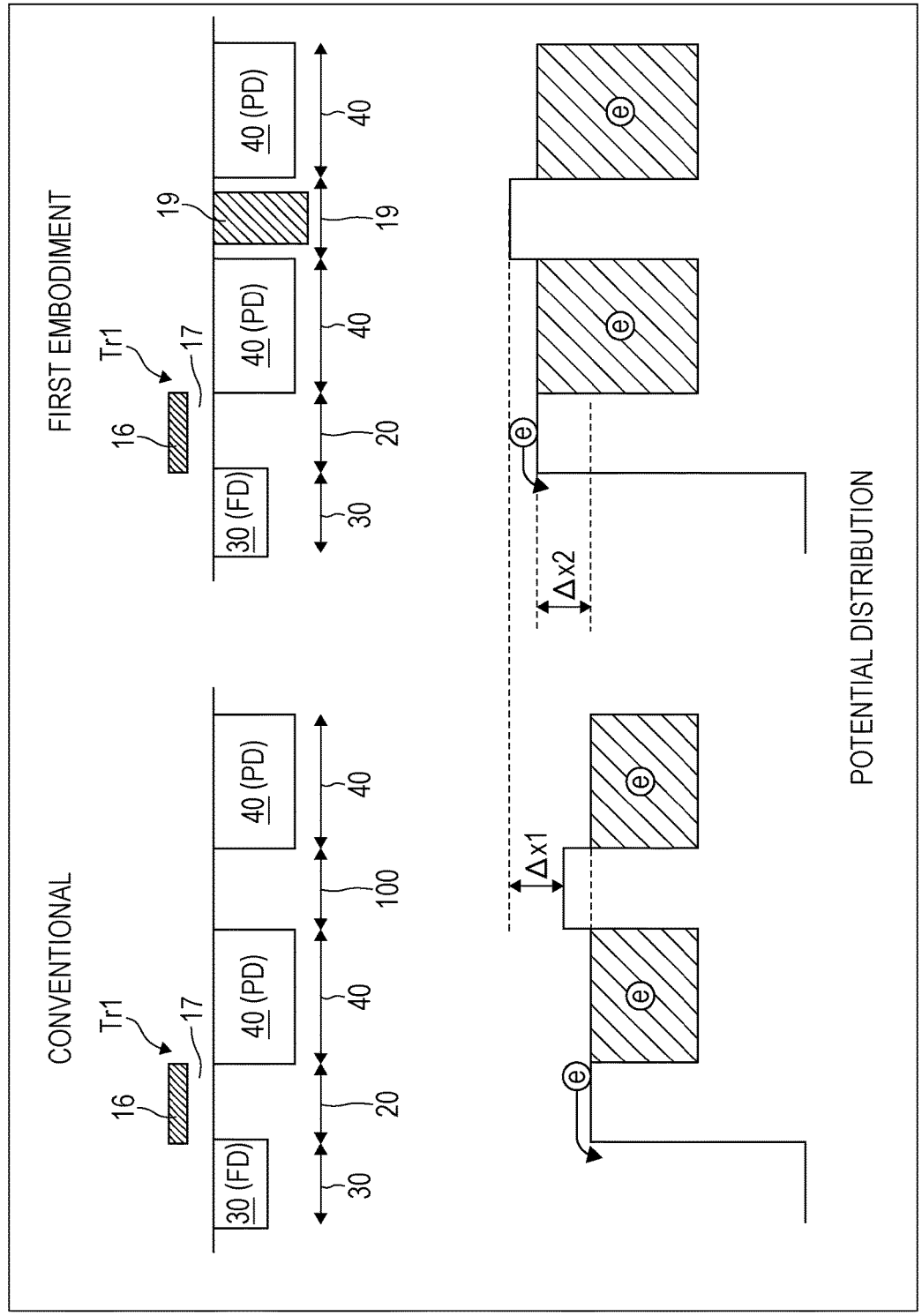

FIG. 6 is a potential distribution diagram of key portions of the solid-state imaging device relating to the first embodiment of the present disclosure and a conventional solid-state imaging device.

Figure 7:
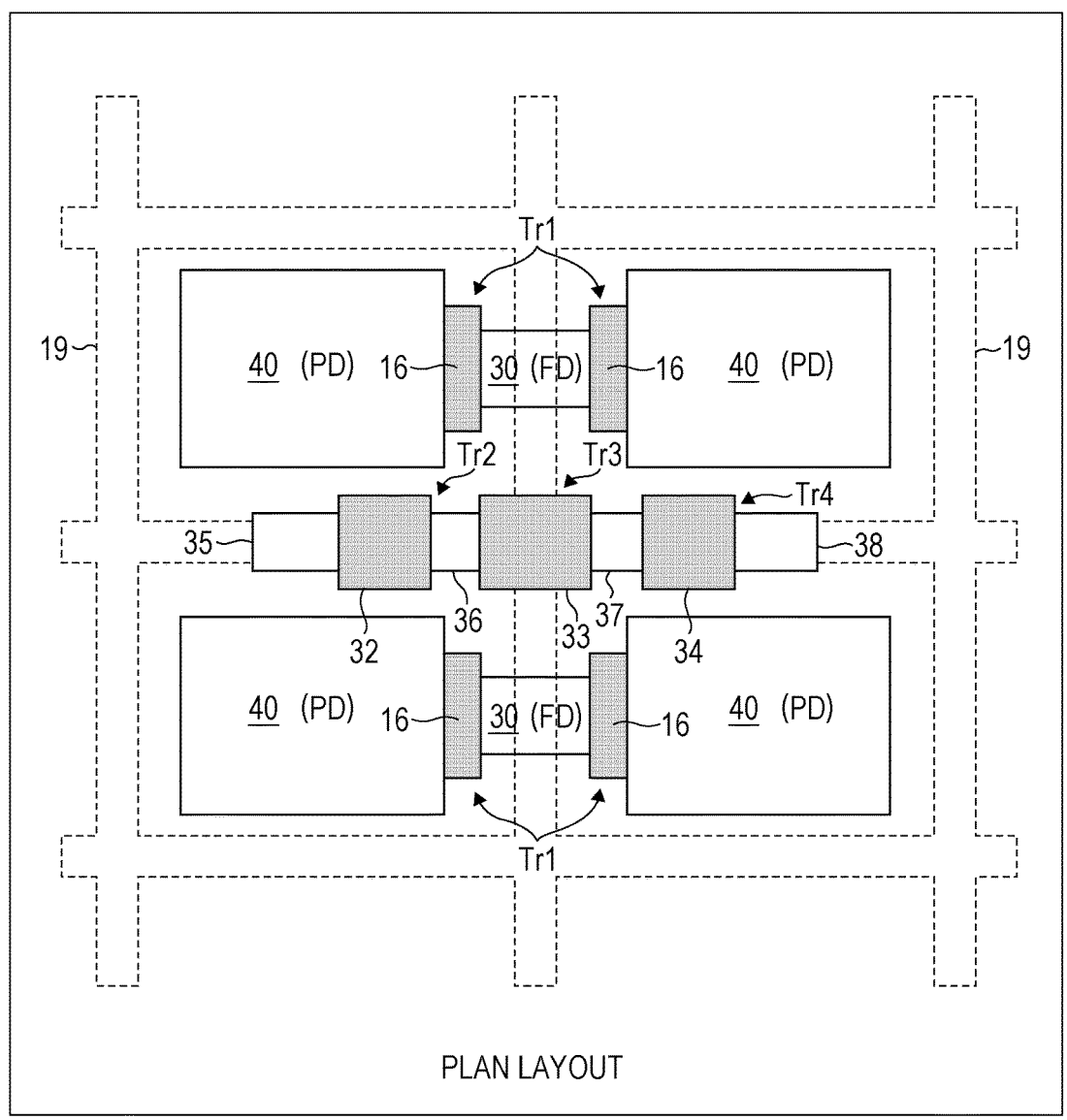

FIG. 7 is a plan layout of the solid-state imaging device relating to a first modified example of the first embodiment.

Figure 8:
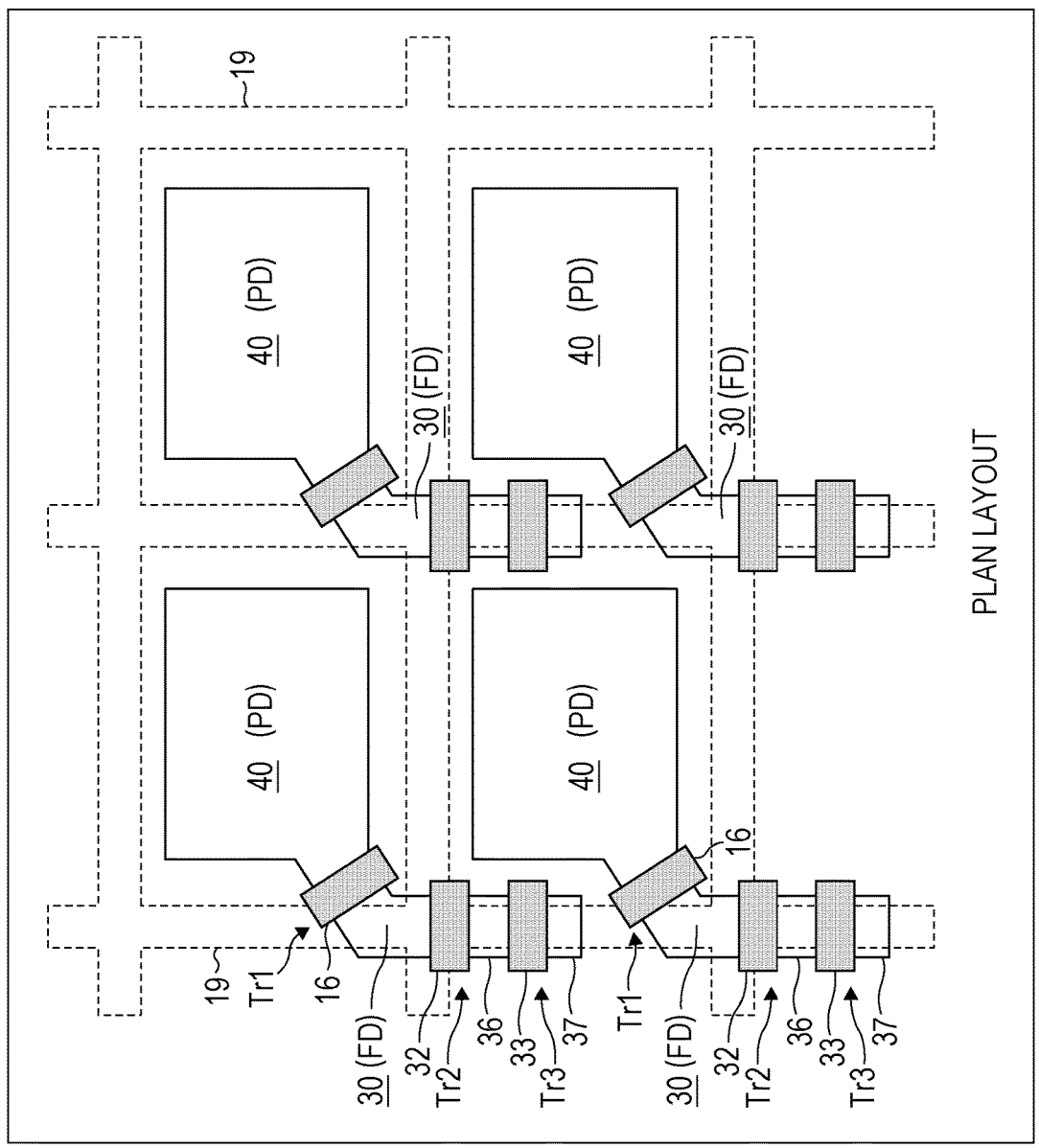

FIG. 8 is a plan layout of the solid-state imaging device relating to a second modified example of the first embodiment.

Figure 9:
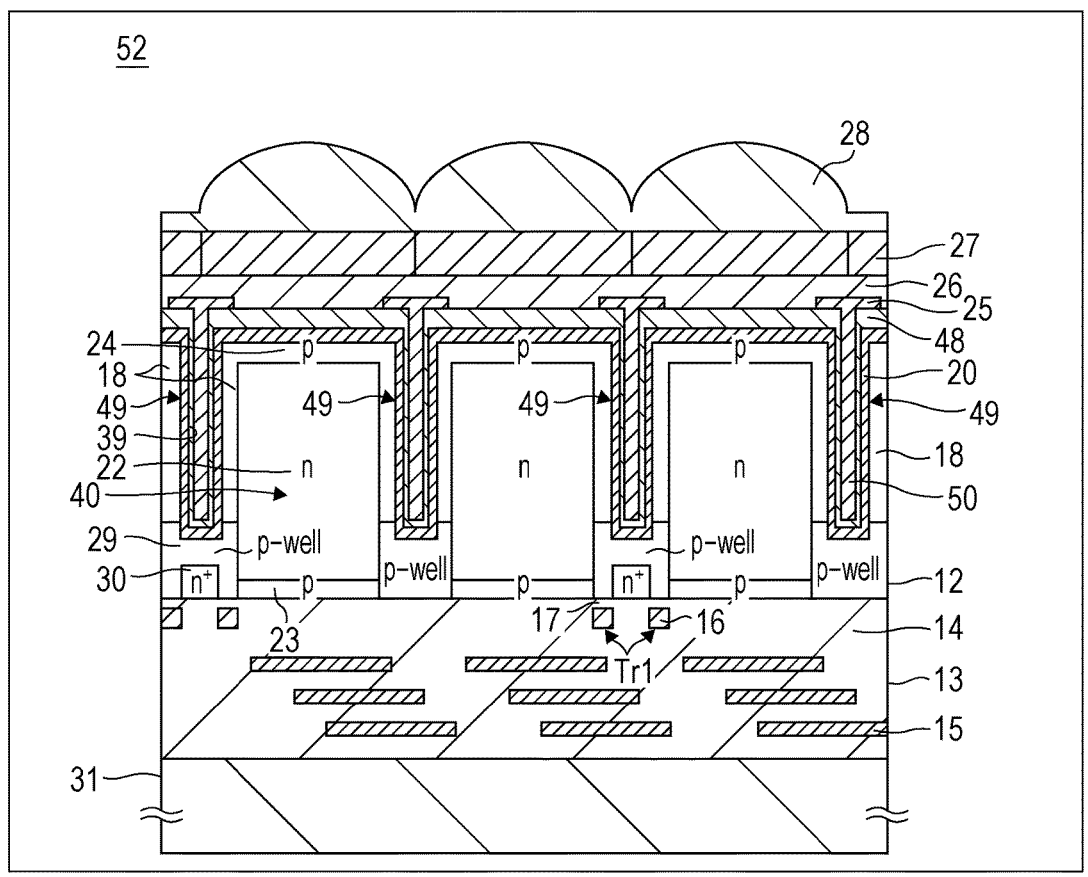

FIG. 9 is a diagram illustrating a configuration of a cross-section of key portions of a solid-state imaging device relating to a second embodiment of the present disclosure.

Figure 10:
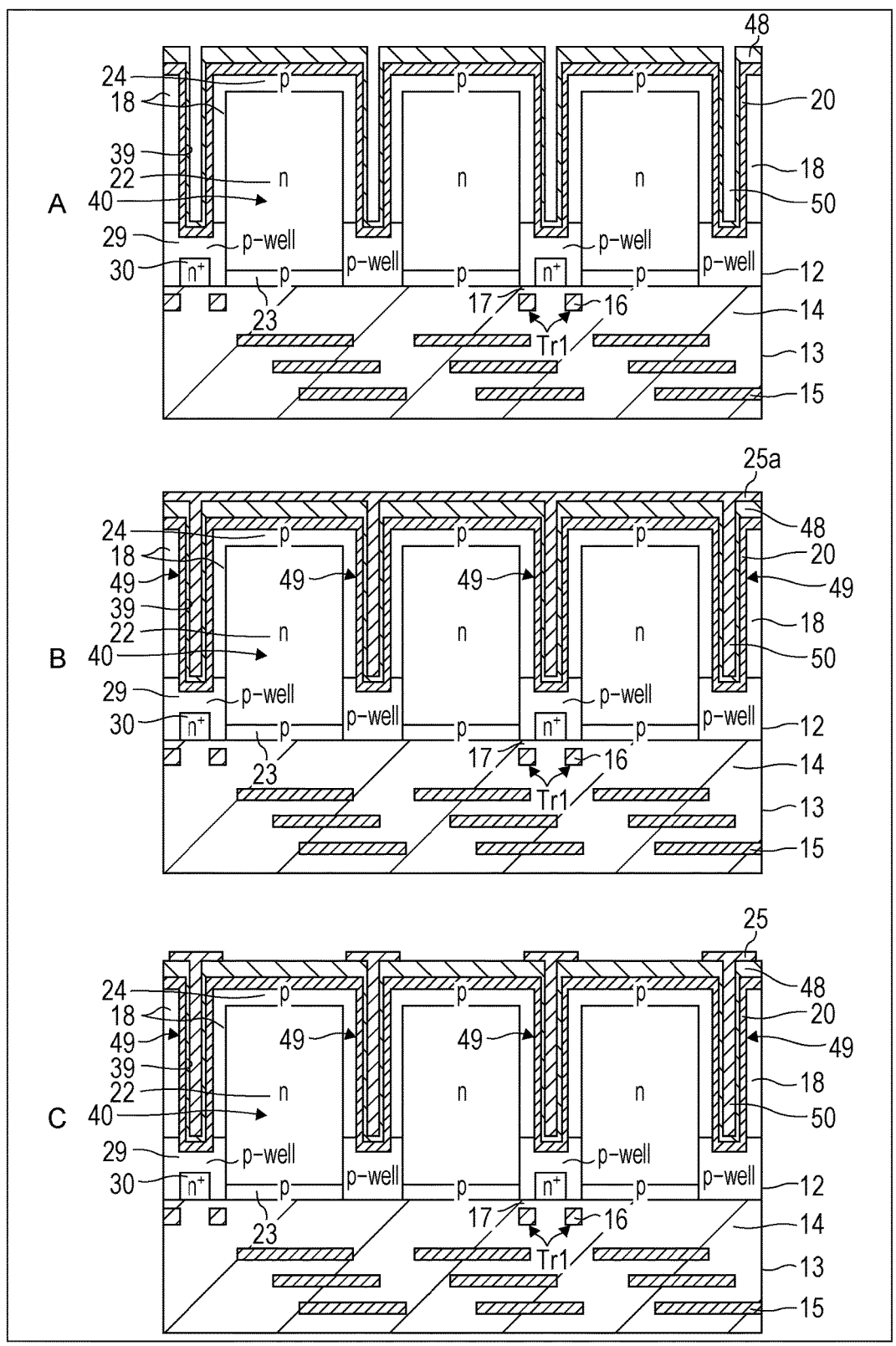

FIG. 10 A in FIG. 10 through C in FIG. 10 are diagrams illustrating a manufacturing method of the solid-state imaging device relating to the second embodiment of the present disclosure.

Figure 11:
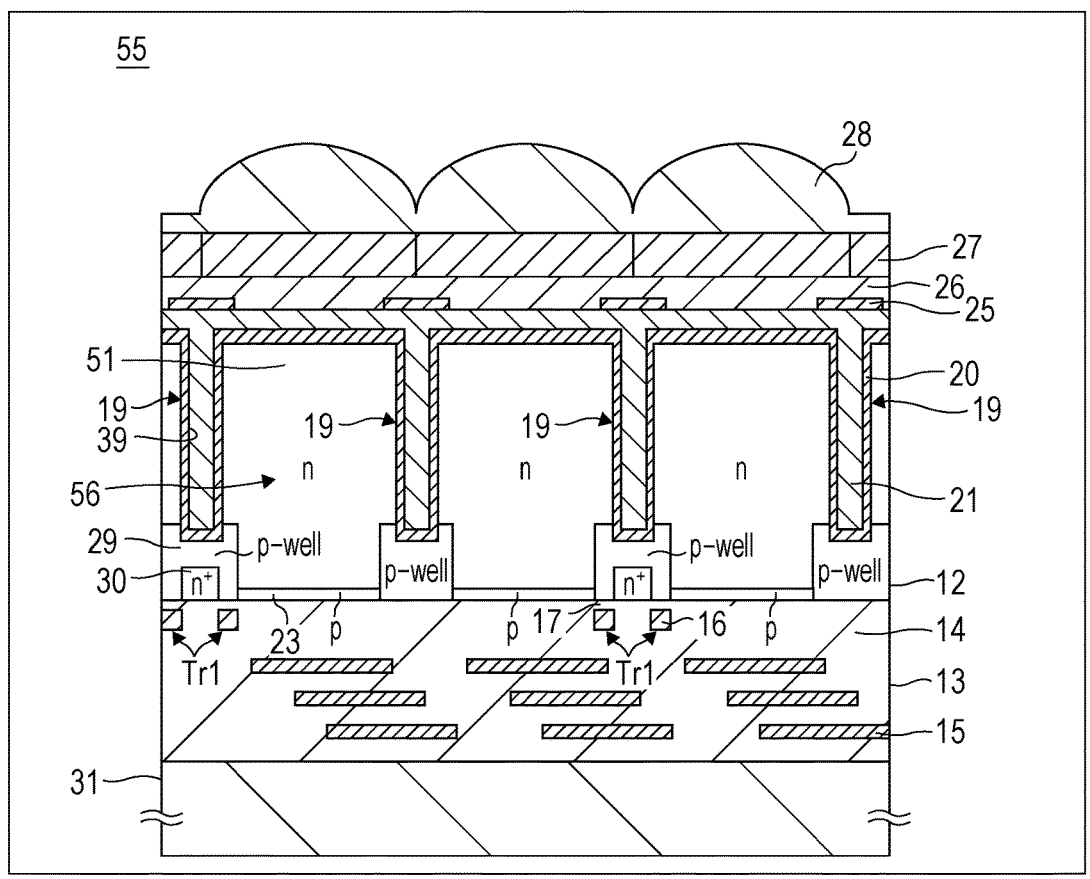

FIG. 11 is a diagram illustrating a configuration of a cross-section of key portions of a solid-state imaging device relating to a third embodiment of the present disclosure.

Figure 12:
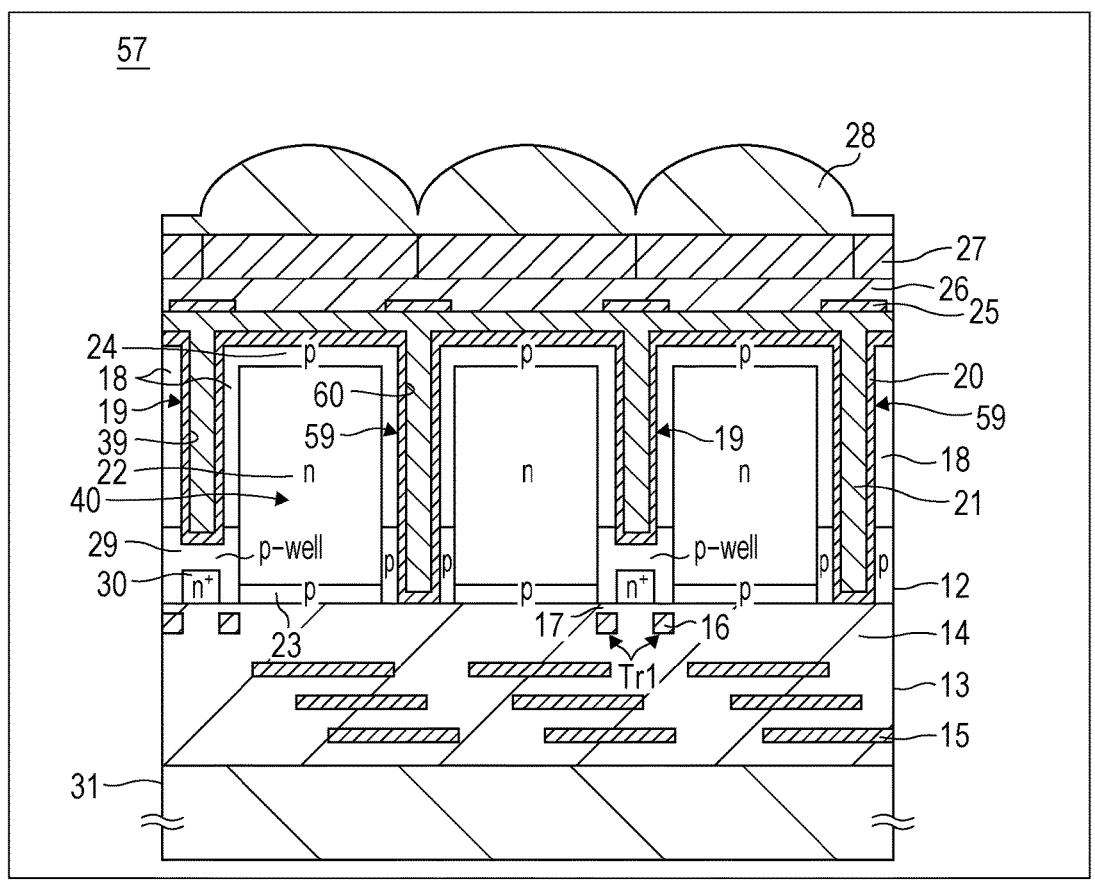

FIG. 12 is a diagram illustrating a configuration of a cross-section of key portions of a solid-state imaging device relating to a fourth embodiment of the present disclosure.

Figure 13:
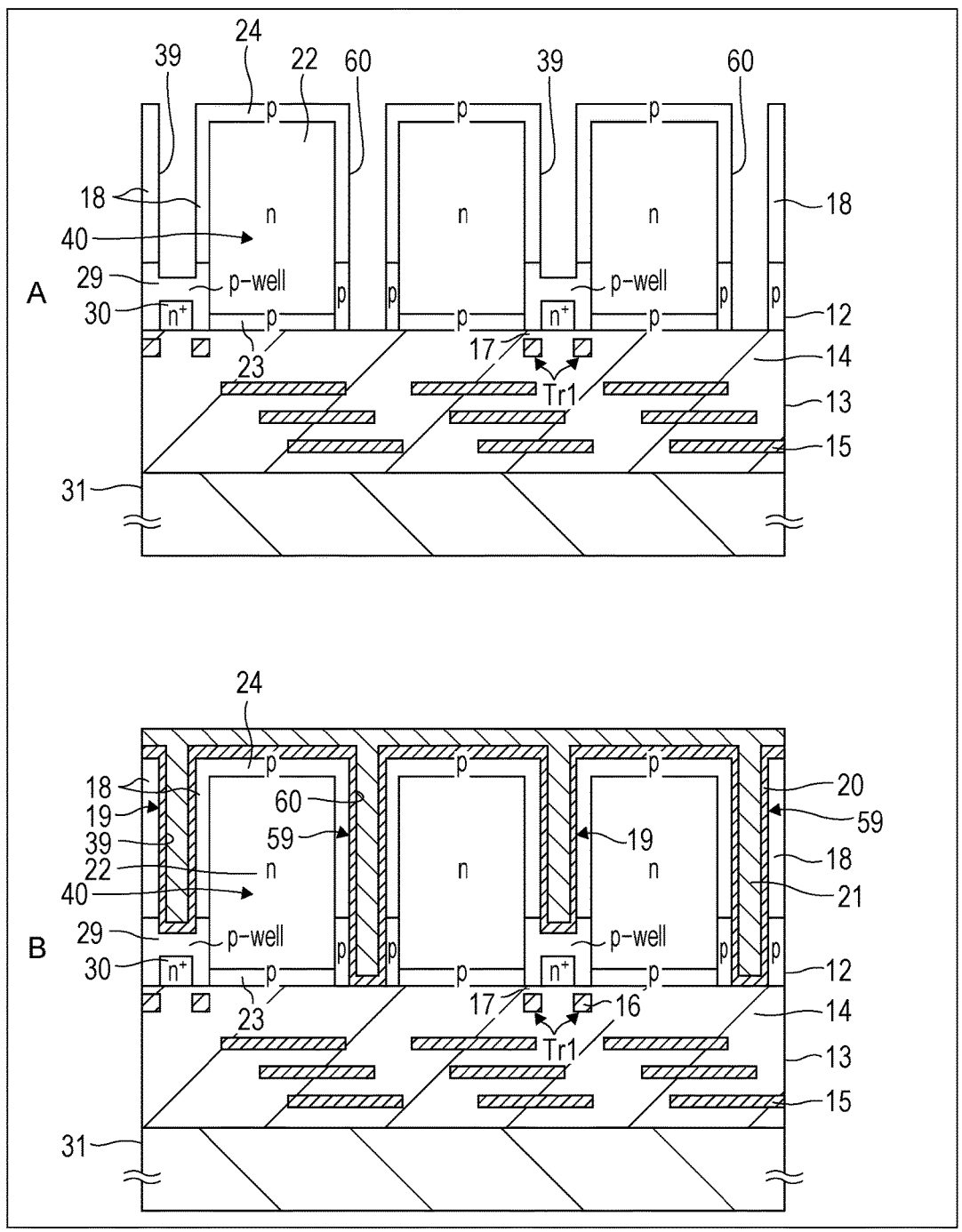

FIG. 13 A in FIG. 13 and B in FIG. 13 are diagrams illustrating a manufacturing method of the solid-state imaging device relating to the fourth embodiment of the present disclosure.

Figure 14:
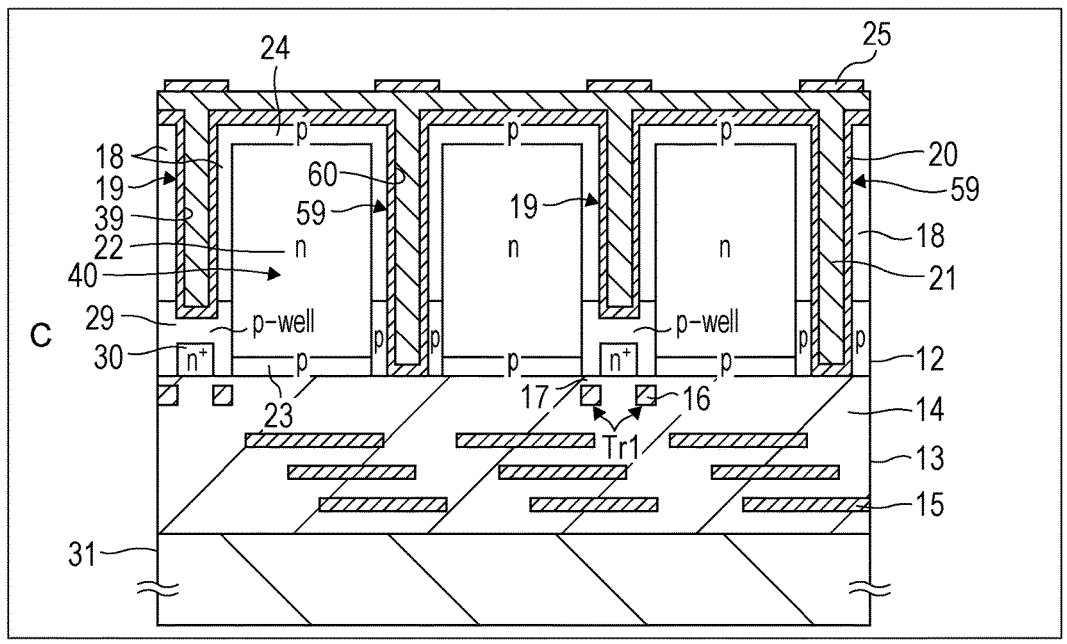

FIG. 14 C in FIG. 14 is a diagram illustrating a manufacturing method of the solid-state imaging device relating to the fourth embodiment of the present disclosure.

Figure 15:
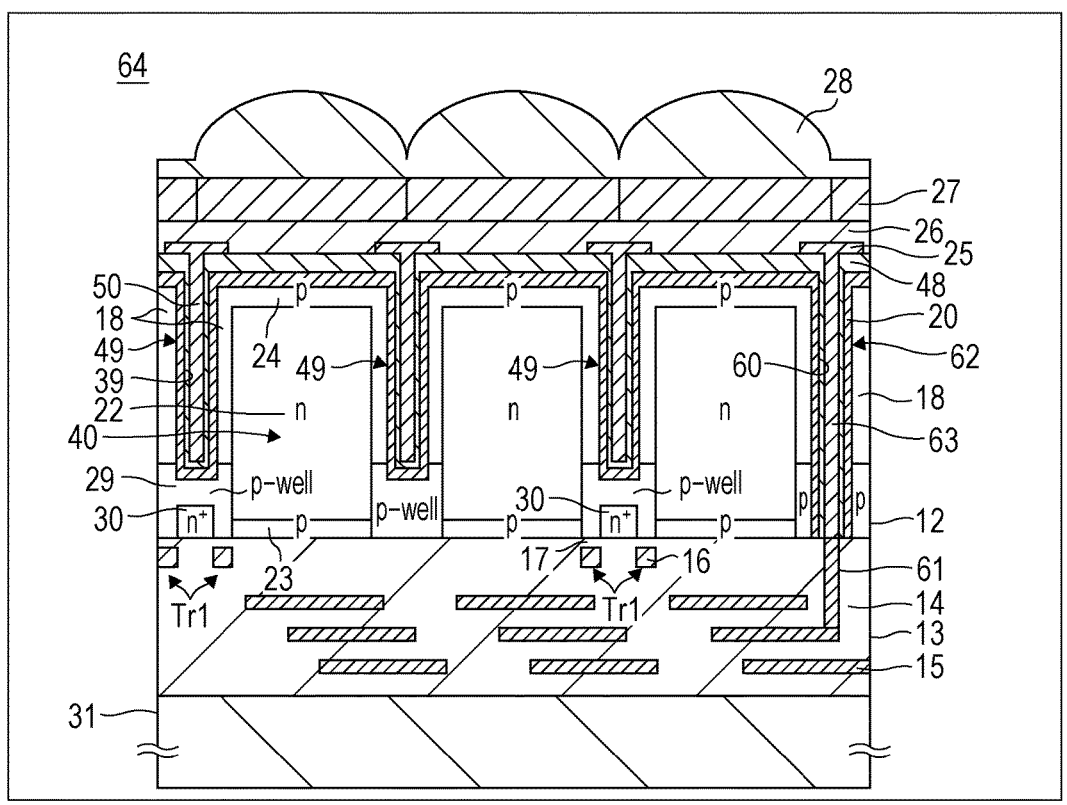

FIG. 15 is a diagram illustrating a configuration of a cross-section of key portions of a solid-state imaging device relating to a fifth embodiment of the present disclosure.

Figure 16:
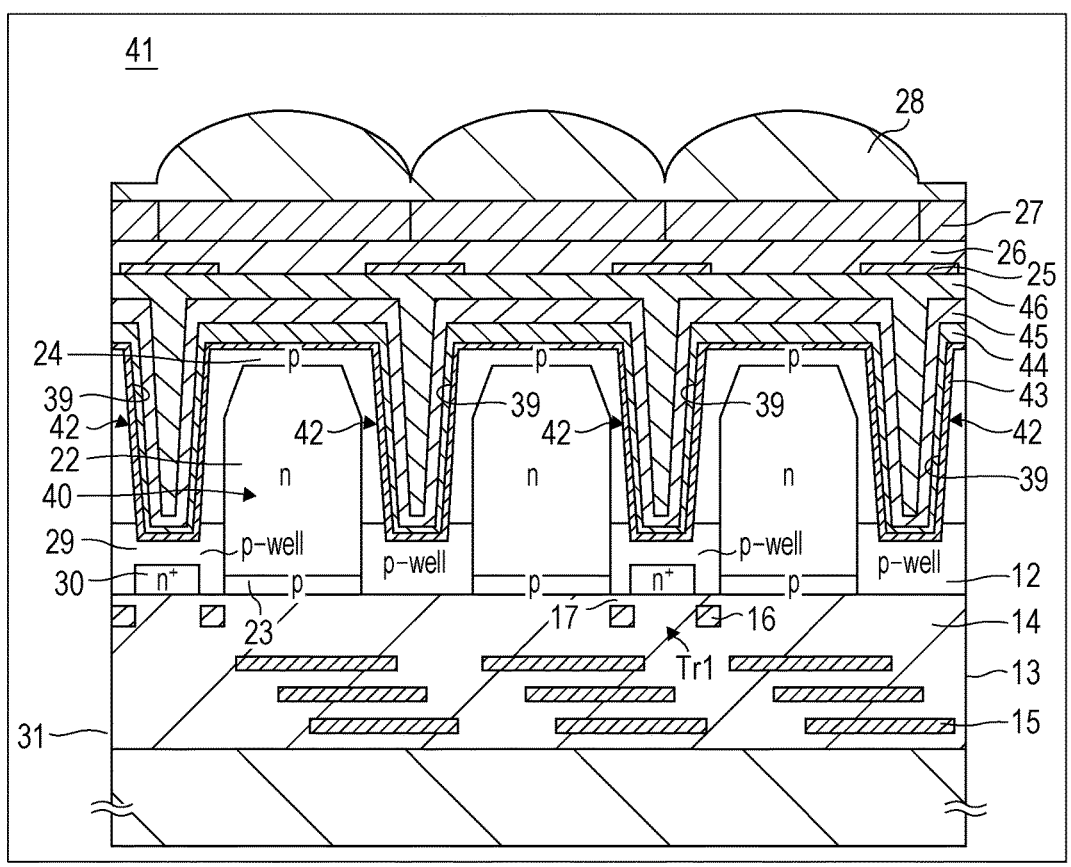

FIG. 16 is a diagram illustrating a configuration of a cross-section of key portions of a solid-state imaging device relating to a sixth embodiment of the present disclosure.

Figure 17:
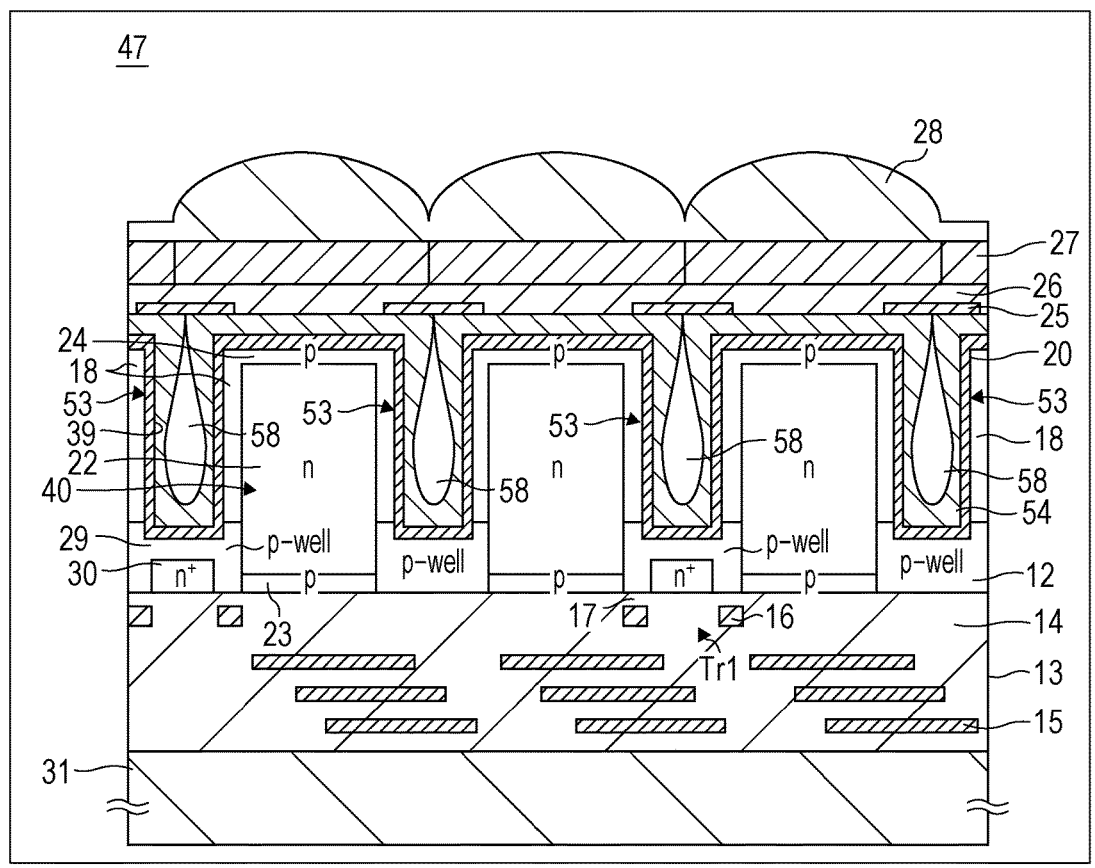

FIG. 17 is a diagram illustrating a configuration of a cross-section of key portions of a solid-state imaging device relating to a seventh embodiment of the present disclosure.

Figure 18:
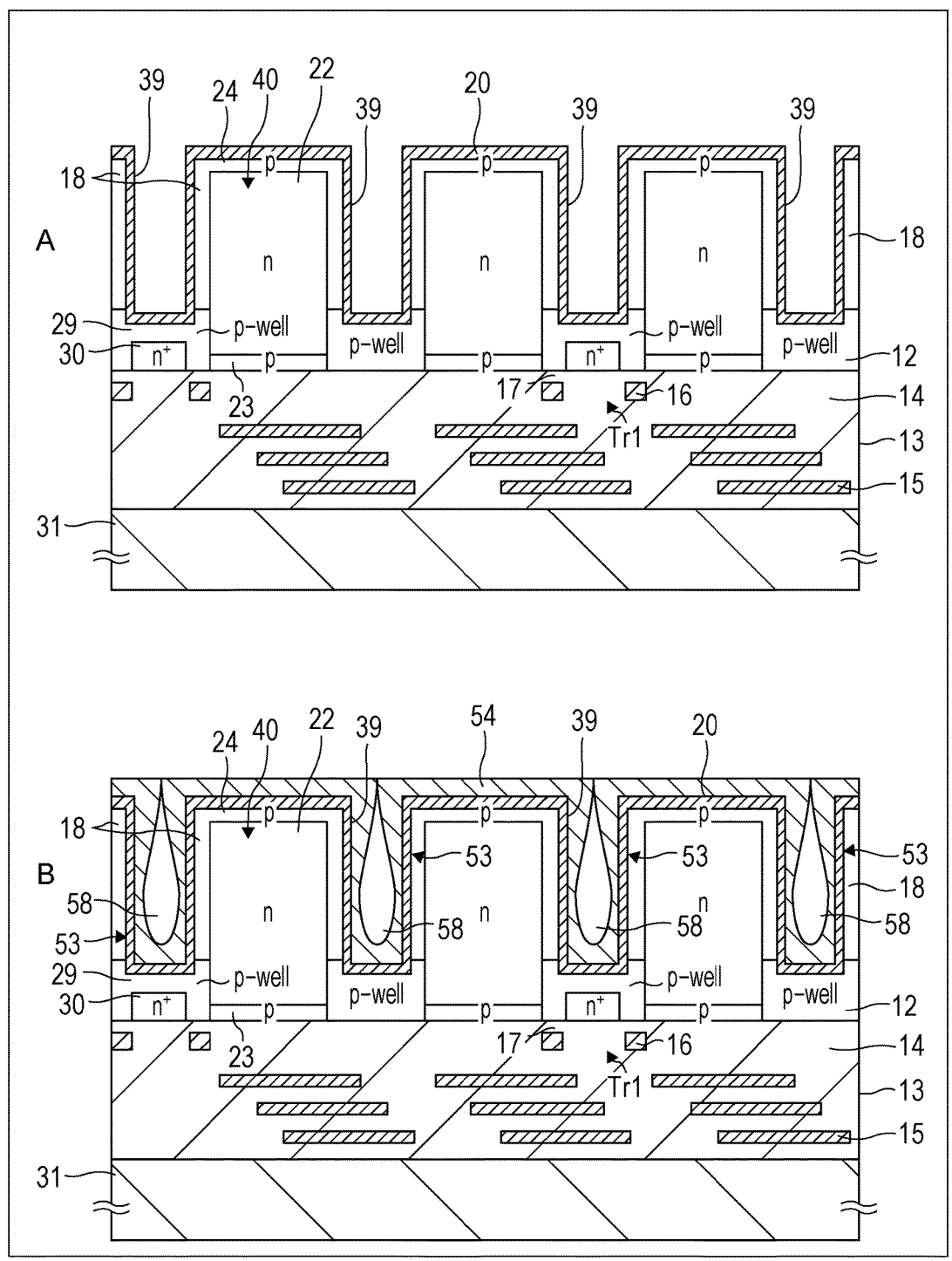

FIG. 18 A in FIG. 18 and B in FIG. 18 are diagrams illustrating a manufacturing method of the solid-state imaging device relating to the seventh embodiment of the present disclosure.

Figure 19:
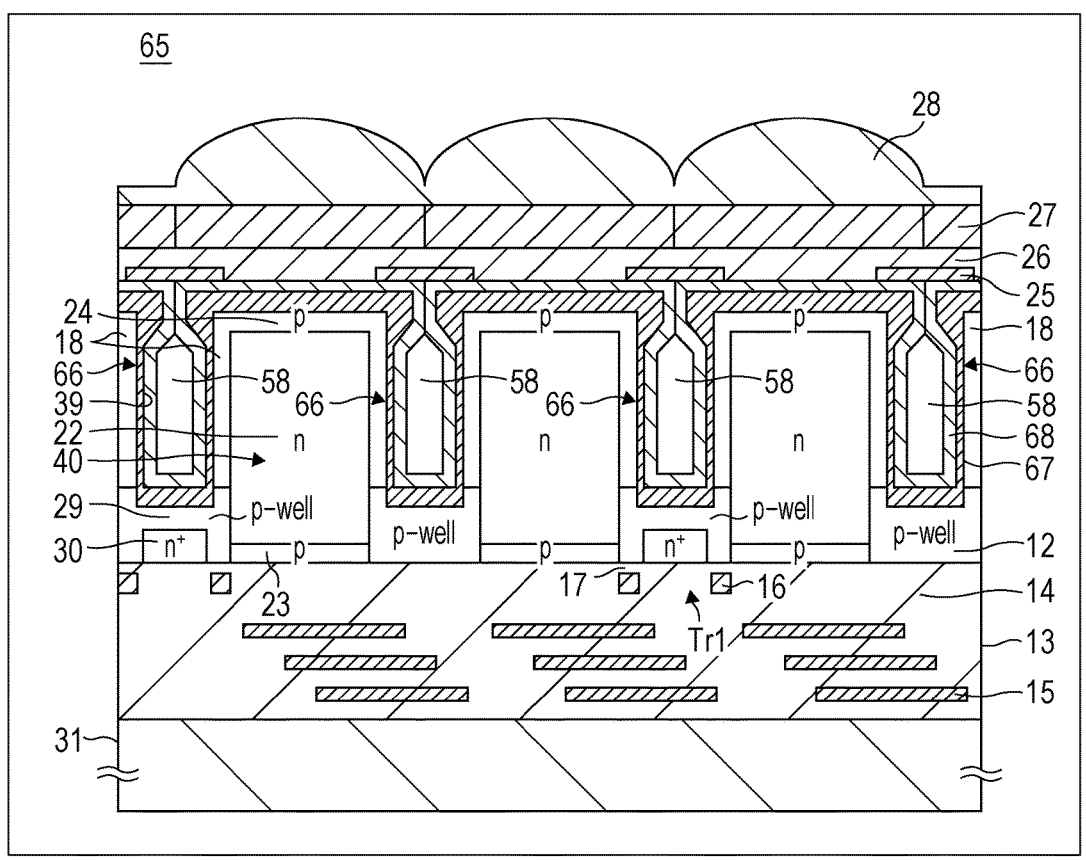

FIG. 19 is a diagram illustrating a configuration of a cross-section of key portions of a solid-state imaging device relating to an eighth embodiment of the present disclosure.

Figure 20:
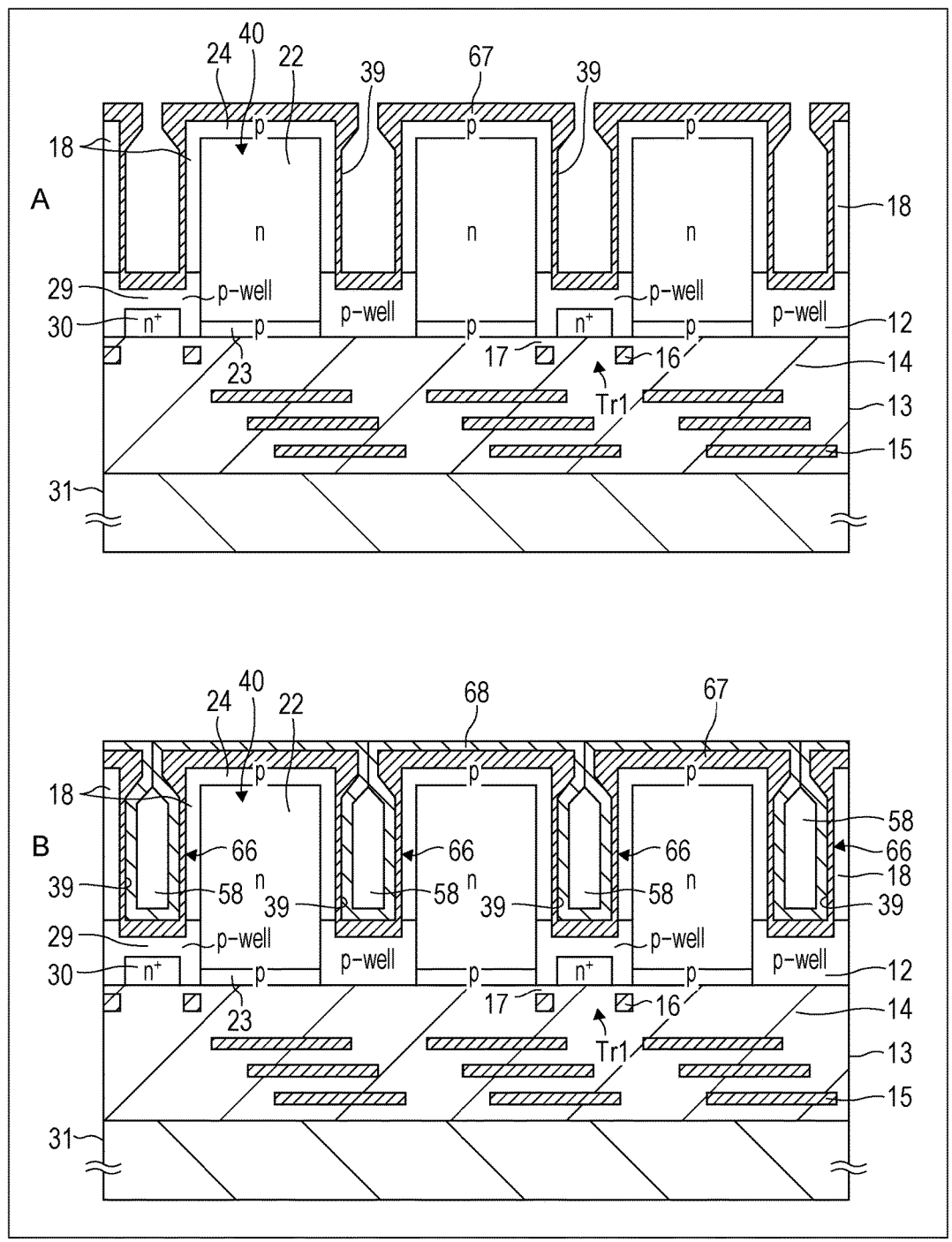

FIG. 20 A in FIG. 20 and B in FIG. 20 are diagrams illustrating a manufacturing method of the solid-state imaging device relating to the eighth embodiment of the present disclosure.

Figure 21:
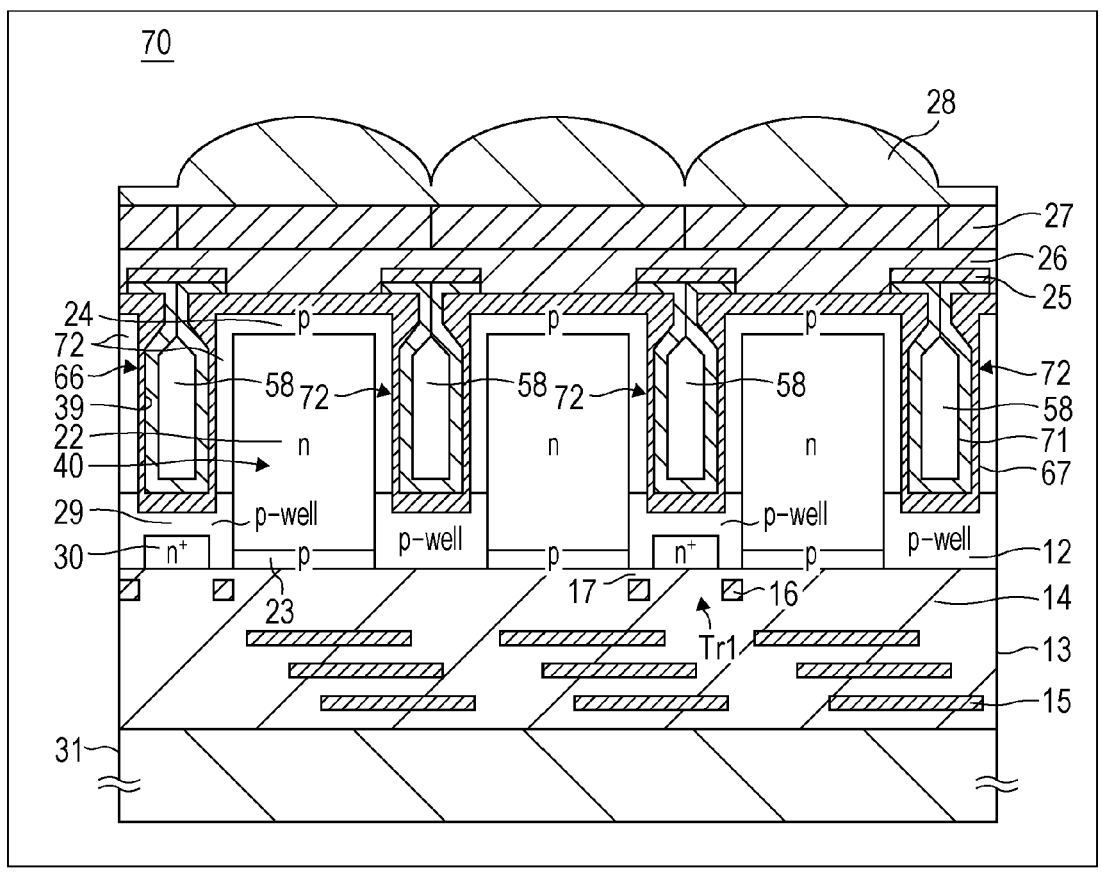

FIG. 21 is a diagram illustrating a configuration of a cross-section of key portions of a solid-state imaging device relating to a modified example.

Figure 22:
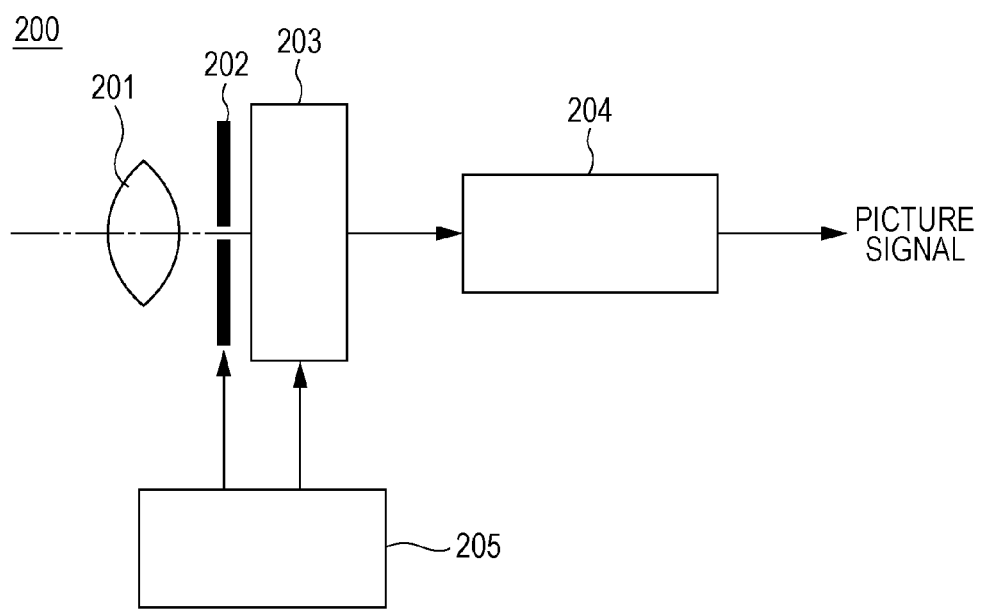

FIG. 22 is a schematic configuration diagram of an electronic device relating to a ninth embodiment of the present disclosure.

DESCRIPTION OF EMBODIMENTS

The present inventors have discovered the following problems in the solid-state imaging device in PTL 1.

In a back-face type solid-state imaging device, a semiconductor layer on which photodiodes are formed is formed thinner compared to a front-face projection type solid-state imaging device. Therefore, in a conventional front-face projection type solid-state imaging device, a configuration has been taken where the signal charge overflowing at the photodiodes is caused to overflow in the depth direction (vertical direction) of the semiconductor layer, but in a back-face projection type solid-state imaging device, causing to overflow in the depth direction of the semiconductor layer is not possible. Therefore, the back-face projection type solid-state imaging device is configured so that the electrons overflowing at the photodiode flow to a floating diffusion (so-called lateral overflow).

In the case of using a lateral overflow configuration, whether the electrons overflowing from the photodiodes flow to the floating diffusion side or flow to an adjacent photodiode side is determined by the potential within the substrate. Accordingly, by setting the potential between the photodiode and floating diffusion to be higher than the potential between the adjacent photodiode and floating diffusion at the time of charge accumulation, the overflowing electron can be transferred to a temporary floating diffusion. Therefore, in the case of a configuration that can transfer the overflowing electron to the floating diffusion, a decrease in saturation charge amount (Qs) becomes a large problem. On the other hand, in the case of increasing the saturation charge amount, signal charge overflowing from a white spot pixel leaks into an adjacent pixel when accumulated over a long period of time, whereby blooming occurs, becoming a cause for resolution deterioration and image quality deterioration.

Also, in a configuration where a blocking film if provided at pixel borders, color mixing that occurs below the blocking film in the case that diagonal light has entered cannot be completely suppressed.

In the embodiments of the present disclosure, a solid-state imaging device that can suppress color mixing, and improve blooming suppression and saturation properties, will be described.

A solid-state imaging device relating to embodiments of the present disclosure, the manufacturing method thereof, and an example of an electronic device, will be described below while referencing FIG. 1 through FIG. 22. The embodiments of the present disclosure will be described in the following order. Note that the present disclosure is not limited to the examples below.

1. First Embodiment: Solid-state Imaging device (example of four pixels sharing one floating diffusion)

1-1 Configuration of overall solid-state imaging device 1-2 Configuration of key portions 1-3 Manufacturing method of solid-state imaging device 1-4 Modification example 1

1-5 Modification example 2

2. Second Embodiment: Solid-state Imaging device (example of blocking film formed within element separation portion)

3. Third Embodiment: Solid-state Imaging device (example of only end portion of substrate back face side of element separation portion touching a p-type semiconductor region.

4. Fourth Embodiment: Solid-state Imaging device (example of element separation portion passing through the substrate)

5. Fifth Embodiment: Solid-state Imaging device (example of a light blocking layer formed in the element separation portion to be connected to a wiring layer)

6. Sixth Embodiment: Solid-state Imaging device (example of forming two solid-state charge film layers in the element separation portion)

7. Seventh Embodiment: Solid-state Imaging device (example of configuration where element separation portion is hollow)

8. Eighth Embodiment: Solid-state Imaging device (example of configuration where element separation portion is hollow)

8-1 Modification example

9. Ninth Embodiment: Electronic device

1. First Embodiment: Solid-State Imaging Device

1-1 Configuration of Overall Solid-State Imaging Device

Figure 1:
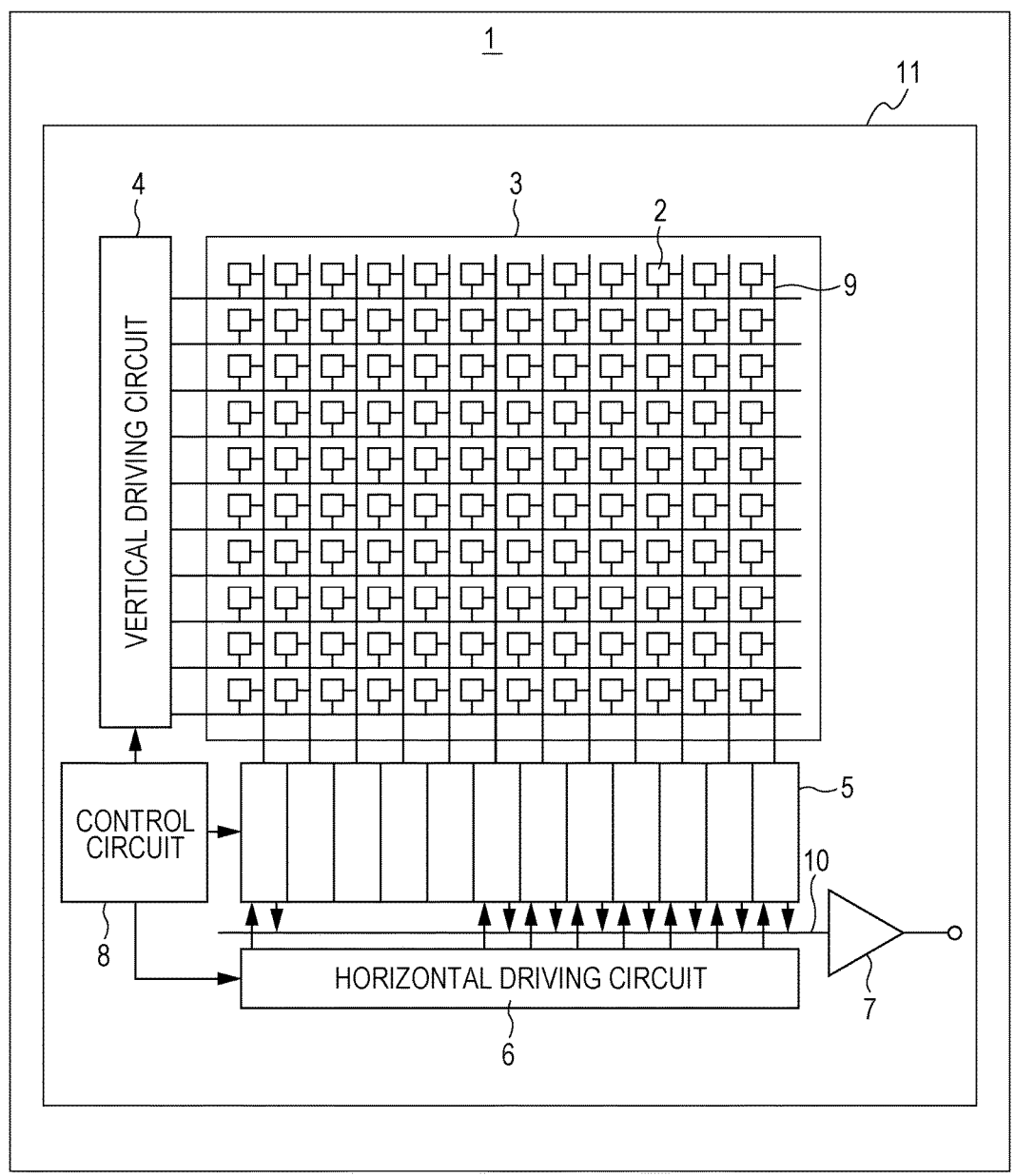
FIG. 1 is a diagram illustrating an overall configuration of a solid-state imaging device relating to a first embodiment of the present disclosure.

FIG. 1 is a schematic configuration diagram illustrating overall a CMOS-type solid-state imaging device relating to a first embodiment of the present disclosure.

A solid-state imaging device 1 of the present embodiment is configured having a pixel region 3 that has multiple pixels 2 arrayed on a substrate 11 made of silicon, a vertical driving circuit 4, column signal processing circuit 5, horizontal driving circuit 6, output circuit 7, and control circuit 8 and the like.

The multiple pixels 2 are configured of multiple pixel transistors and a photoelectric converter made of a photodiode, and are arrayed regularly in a two-dimensional array on the substrate 11. The pixel transistor configuring the pixel 2 may be four MOS transistors made up of a transfer transistor, reset transistor, selecting transistor, and amplifying transistor, or may be three transistors excluding the selecting transistor.

The pixel region 3 has multiple pixels 2 regularly arrayed in a two-dimensional array. The pixel region 3 is configured of an effective pixel region that actually receives light, amplifies the signal charge generated by photoelectric conversion, and reads out to the column signal processing circuit 5, and a black standard pixel region (unshown) for outputting optical black that will be the standard for the black level. The black standard pixel region is normally formed on the periphery of the effective pixel region.

The control circuit 8 generates a clock signal and control signal and the like serving as a standard for operations of the vertical driving circuit 4, column signal processing circuit 5, and horizontal driving circuit 6 and so forth, based on a vertical synchronizing signal, horizontal synchronizing signal, and master clock. The clock signal and control signal and the like generated by the control circuit 8 are input into the vertical driving circuit 4, column signal processing circuit 5, horizontal driving circuit 6, and so forth.

The vertical driving circuit 4 is configured by a shift register, for example, and selectively scans each of the pixels 2 of the pixel region 3, in row increments, sequentially in the vertical direction. Also, the pixel signals based on the signal charge generated according to the light receiving amount in the photodiodes of each of the pixels 2 are supplied to the column signal processing circuit 5 through a vertical signal line.

The column signal processing circuit 5 is disposed in each row of the pixels 2, for example, and performs signal processing such as noise reduction and signal amplification and the like on signals output from one row worth of pixels 2 with signals from the black standard pixel region (unshown, but formed on the periphery of the effective pixel region) for each column of pixels. A horizontal selecting switch (unshown) is provided between the output step of the column signal processing circuit 5 and the horizontal signal line 10.

The horizontal driving circuit 6 is configured with a shift register, for example, sequentially selects each of the column signal processing circuits 5 by sequentially outputting a horizontal scanning pulse, and outputs a pixel signal from each of the column signal processing circuits 5 to the horizontal signal line 10.

The output circuit 7 performs signal processing, and outputs, as to the sequentially supplied signals from each of the column signal processing circuits 5 through the horizontal signal line 10.

1-2 Configuration of Key Portions

Figure 2:
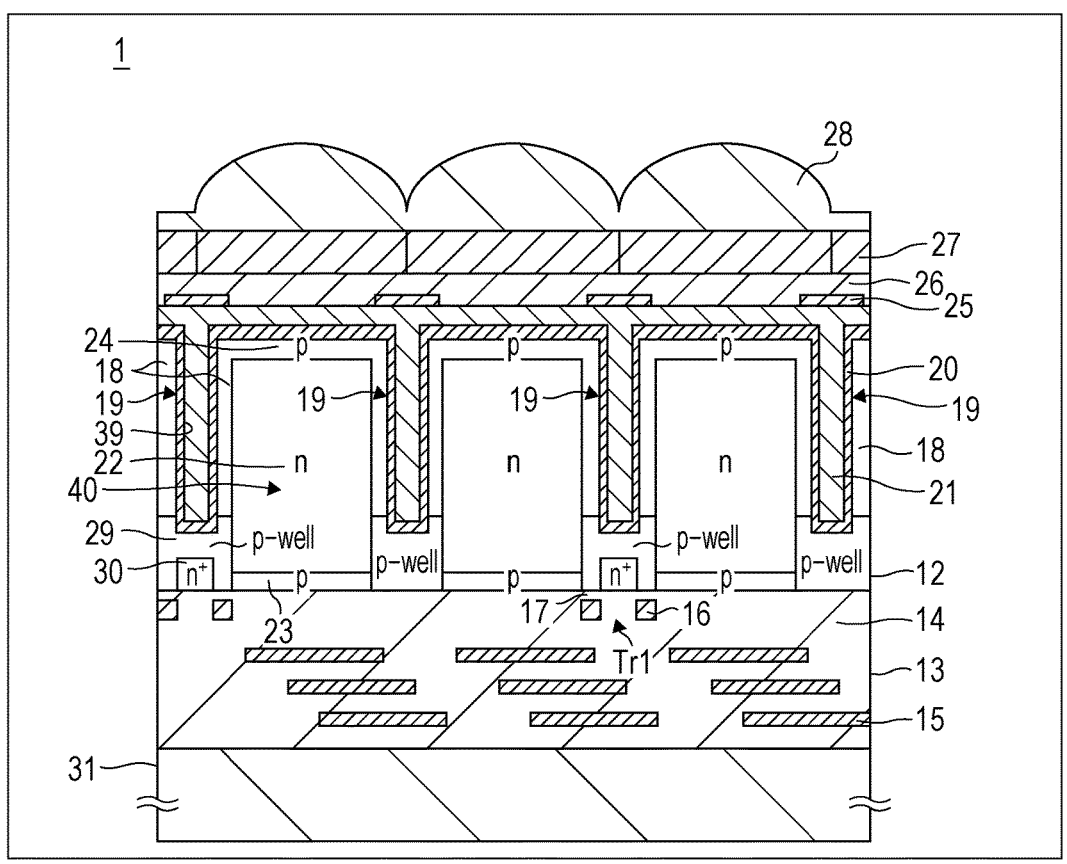
FIG. 2 is a diagram illustrating a configuration of a cross-section of key portions of the solid-state imaging device relating to the first embodiment of the present disclosure.
Figure 3:
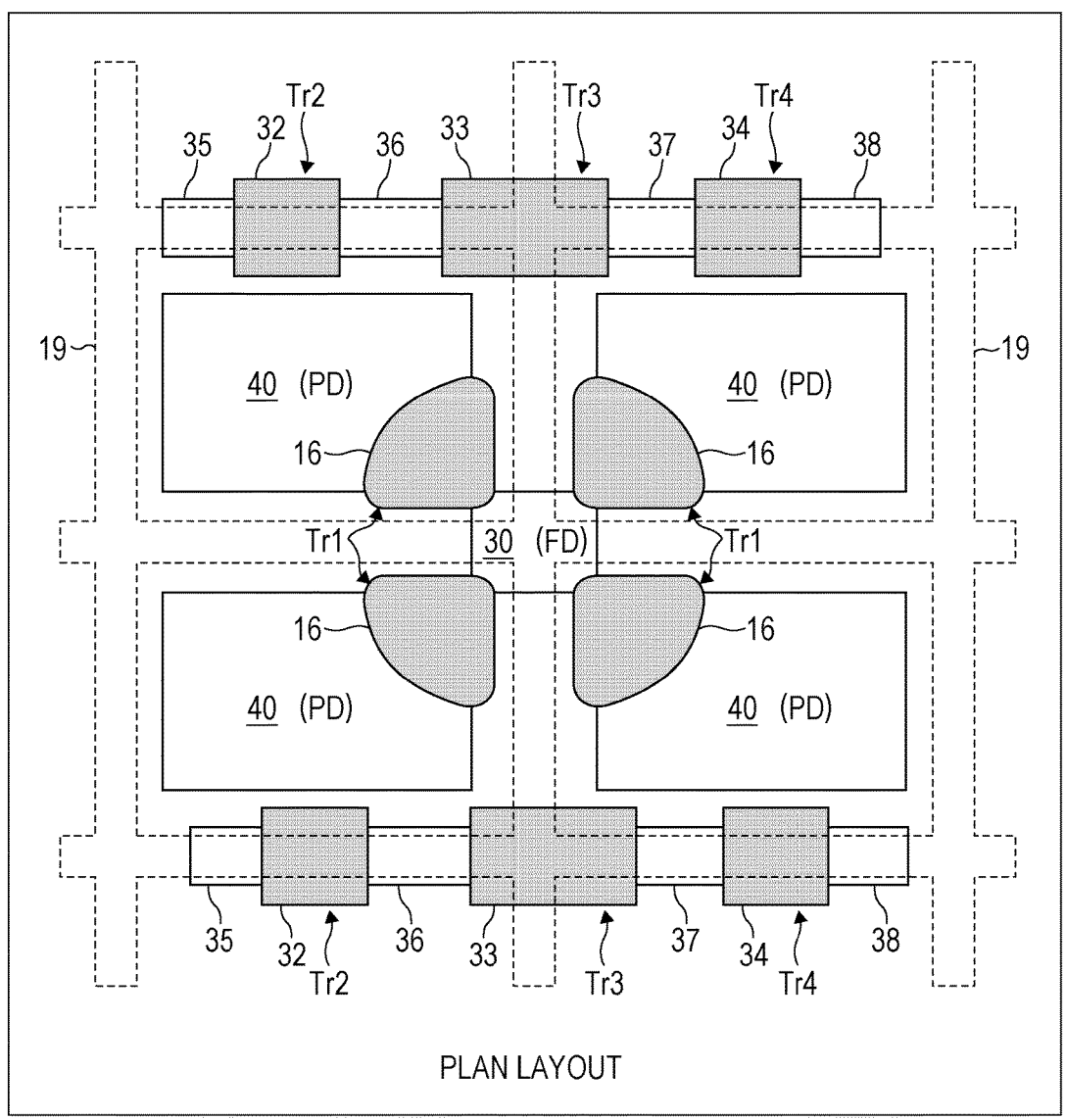
FIG. 3 is a plan layout of the solid-state imaging device relating to the first embodiment of the present disclosure.

FIG. 2 illustrates a cross-sectional configuration in the pixel region 3 of the solid-state imaging device 1 of the present embodiment, and FIG. 3 illustrates a plan layout of the pixel region 3 of the solid-state imaging device 1 of the present embodiment. The solid-state imaging device 1 of the present embodiment is exemplified by a back-face projection type CMOS-type solid-state imaging device, and is an example of a so-called four-pixel sharing being one unit, where a required pixel transistor is shared as to four photoelectric converters. Also, in the description below, a first conducting type will be described as a p-type, and a second conducting type as an n-type.

As illustrated in FIG. 2, the solid-state imaging device 1 of the present embodiment has a substrate 12 having multiple pixels, a wiring layer 13 formed on the front face side of the substrate 12, and a supporting substrate 31. Also, an insulating film having a fixed charged (hereafter, fixed charge film) 20, an insulating film 21, light blocking film 25, planarizing film 26, color filter layer 27, and on-chip lens 28 are further provided, formed sequentially on the back face side of the substrate 12.

The substrate 12 is configured with a semiconductor substrate made of silicon, and is formed having a thickness of 1 µm to 6 µm, for example. Multiple photoelectric converters 40 made of a photodiode, and pixels configured of multiple pixel transistors (Tr1 through Tr4) making up a pixel circuit unit are formed in a two-dimensional matrix in the pixel region 3 of the substrate 12. Also, adjacent photoelectric converters 40 are separated electrically by an element separating unit 19. Also, while not shown in the diagram in FIG. 2, peripheral circuit portions are configured in the periphery region of the pixel region formed on the substrate 12.

The photoelectric converter 40 is configured of first conductive type (hereafter, p-type) semiconductor regions 23 and 24 that are formed on the front face side and back face side of the substrate 12, and a second conductive type (hereafter, n-type) semiconductor region 22 formed therebetween. With the photoelectric converter 40, primary photodiodes are configured at pn junctions between the p-type semiconductor regions 23 and 24 and the n-type semiconductor region 22. With the photoelectric converter 40, signal charge according to the light amount of the incident light is generated and accumulated in the n-type semiconductor region 22. Also, electrons that serve as the cause of dark current occurring at the interface of substrate 12 are absorbed into multiple holes which are carriers in the p-type semiconductor regions 23 and 24 formed on the front face and back face of the substrate 12, whereby dark current is suppressed.

Also, the photoelectric converters 40 are each electrically separated by a pixel separating layer 18 configured with a p-type semiconductor region and an element separating unit 19 formed within the pixel separating layer 18 thereof.

According to the present embodiment, as illustrated in FIG. 3, the pixel transistor is configured of four transistors, which are a transfer transistor Tr1, reset transistor Tr2, amplifying transistor Tr3, and selecting transistor Tr4.

As illustrated in FIG. 3, the transfer transistor Tr1 is configured of a floating diffusion unit 30 formed in the center portion of the four photoelectric converters 40 that has been formed in two rows and two columns, and a transfer gate electrode 16. The floating diffusion unit 30 is configured with a n-type semiconductor region that has been formed by an n-type impurity being subjected to ion injection at high concentration into the p-well layer 29 formed on the front face side of the substrate 12, as illustrated in FIG. 2. Also, the transfer gate electrode 16 is formed on the substrate 12 front face side between the photoelectric converter 40 and floating diffusion unit 30, via a gate insulation layer 17.

Of the pixel transistors, the reset transistor Tr2, amplification transistor Tr3, and selecting transistor Tr4 are formed for every four photoelectric converters 40 that share a floating diffusion unit 30. These pixel transistors are disposed on one side of a group configured with four photoelectric converters 40 as illustrated in FIG. 3.

The reset transistor Tr2 is configured from a pair of source/drain regions 35 and 36, and a reset gate electrode 32 formed between the source/drain regions 35 and 36 thereof. The amplifying transistor Tr3 is configured from a pair of source/drain regions 36 and 37, and an amplifying gate electrode 33 formed between the source/drain regions 36 and 37 thereof. The selecting transistor Tr4 is configured from a pair of source/drain regions 37 and 38, and a selector gate electrode 34 formed between the source/drain regions 37 and 38 thereof.

The diagram illustrations of the cross-sectional configurations of the reset transistor Tr2, amplifying transistor Tr3, and selecting transistor Tr4 are omitted, but these pixel transistor are also configured similar to the transfer transistor Tr1. That is to say, the source/drain regions 35 through 38 are configured in an n-type high concentration impurity region formed within a p-well layer 29 on the front face of the substrate 12, similar to the floating diffusion unit 30. Also, the reset gate electrode 32, amplifying gate electrode 33, and selecting gate 34 are formed via the gate insulating film 17 on the front face side of the substrate 12.

The element separating unit 19 is configured with a fixed charge film 20 and insulating film 21 that are form so as to be imbedded in sequence within the groove portion 39, which is formed in the depth direction from the back face side of the substrate 12, and formed so as to be carved within the pixel separating layer 18 formed on the substrate 12. That is to say, the element separating unit 19 is formed in a grid shape so as to surround the pixels, as illustrated in the diagram. Also, in the case that the pixel transistor is formed between adjacent photoelectric converter 40 and photoelectric converter 40, disposal is made so as to overlap floating diffusion unit 30 and source/drain region.

Also, the element dividing portion 19 is formed in a depth reaching the p-well layer 29 in which the pixel transistor is formed, and formed at a depth that does not reach the floating diffusion unit 30 or source/drain region. If the depth of the floating diffusion unit 30 and source/drain region is less than 1 μm, the element dividing unit 19 can be formed at a depth of up to approximately 0.25 to 5.0 μm from the substrate 12 front face. According to the present embodiment, the formation is at a depth reaching the p-well layer 29 of the pixel transistor, but only has to be formed so that the end portion of the element separating unit 19 at the substrate 12 back face side touches the p-type semiconductor, and the depth does not necessarily have to reach the p-well layer 29. In the case of forming within the pixel separating layer 18 that is made of a p-type semiconductor layer as with the present embodiment, even with a configuration that does not reach the p-well layer 29, the advantages of the insulation separation can be obtained.

Also, the fixed charge film 20 formed in the groove portion 39 on the inner periphery face and base face of the groove portion 39, and is also formed over the entire back face of the substrate 12. Note that in the description below, the inner periphery face and base face of the groove portion 30 are described together as "inner wall face". As a fixed charge film 20, using a material that can cause a fixed charge to occur by laminating onto a substrate such as silicon or the like and strengthening the pinning is desirable, and a high refractive index material film or high conductivity film having a negative charge can be used. As a specific material, for example, an oxide or nitride material including at least one of the elements of hafnium (Hf), aluminum (Al), zirconium (Zr), tantalum (Ta), and titanium (Ti) can be used. As a film forming method, for example a chemical vapor deposition method (hereinafter, CVD (Chemical Vapor Deposition) method), sputtering method, atomic layer deposition method (hereinafter, ALD (Atomic Layer Deposition) method), and the like may be given. By using the ALD method, a SiO2 film that reduces the interface level in the film can be formed simultaneously at a film thickness of approximately 1 nm. Also, as materials other than those described above, an oxide or nitride material including at least one of the elements of Lanthanum (La), Praseodymium (Pr), Cerium (Ce), Neodymium (Nd), Promethium (Pm), Samarium (Sm), Europium (Eu), Gadolinium (Gd), Terbium (Tb), Dysprosium (Dy), Holmium (Ho), Thulium (Tm), Ytterbium (Yb), Lutetium (Lu), and Yttrium (Y) may be given. Further, the fixed charge film described above may be formed with an oxynitride hafnium film or an oxynitride aluminum film.

Silicon (Si) and nitrogen (N) may be added to the materials in the film for the above-described fixed charge film 20, within a range of not losing insulation properties. The concentration thereof is determined appropriately to be in a range that the film does not lose insulation properties. Thus, by adding silicon (Si) and nitrogen (N), heat resistance of the film and the capability to inhibit ion injection during processing can be increased.

With the present embodiment, a fixed charge film 20 having a negative charge is formed on the inner wall face of the groove portion 39 and the back face of the substrate 12, whereby an inversion layer is formed on the face touching the fixed charge film 20. Thus, the silicon interface is pinned by the inversion layer, so the occurrence of dark current is suppressed. Also, in the case of forming a groove portion 39 in the substrate 12, physical damage occurs to the side wall and base face of the groove portion 39, and there is a possibility of unpinning occurring in the periphery portion of the groove portion 39. To counter this problem point, with the present embodiment, unpinning can be prevented by forming a fixed charge film 20 having a large fixed charge on the side wall and base face of the groove portion 39.

The insulating film 21 is imbedded in the groove portion 39 on which the fixed charge film 20 is formed, and is formed on the entire back face side of the substrate 12. It is favorable to form the material for the insulation layer 21 with a material having a refractive index differing from the fixed charge film 20, and for example, silicon oxide, silicon nitride, silicon oxynitride, resin, and so forth can be used. Also, a material having a feature of not having a positive fixed charge or having a small positive fixed charge can be used for the insulating film 21.

Also, by the groove portion 39 being embedded in the insulating film 21, the photoelectric converters 40 that configure the pixels are separated via the insulation layer 21. Thus, it is difficult for the signal charge to leak into an adjacent pixel, wherein in a case that a signal charge exceeding a saturation charge amount (Qs) occurs, the leaked signal charge leaking into the adjacent photoelectric converter 40 can be reduced. Therefore, electronic color mixing can be suppressed.

Also, the two-layer configuration of the fixed charge film 20 and insulating film 21 formed on the back face side which is the incident face side of the substrate 12 has the function of a reflection preventing film because of the difference in refractive index thereof. Thus, reflection on the back face side of the substrate 12 of light that is input from the back face side of the substrate 12 is prevented.

The light blocking film 25 is formed on a desired region on the insulating film 21 that is formed on the back face of the substrate 12, and in the pixel region is formed in a grid shape so as to open the photoelectric converter 40. That is to say, the light blocking firm 25 is formed at a position corresponding to the element separating unit 19. The material to configure the light blocking film 25 only has to be a material that blocks light, and for example, tungsten (W), aluminum (Al), or copper (Cu) may be used.

The planarizing film 26 is formed over the entire insulating film 21 including the light blocking film 25, whereby the face on the back face side of the substrate 12 is planarized. An organic material such as a resin, for example, can be used as the material for the planarizing film 26.

The color filter layer 27 is formed on the upper face of the planarizing film 26, and is formed corresponding to R (red), G (green), B (blue), for example, for each pixel. With the color filter layer 27, a desired wavelength of light is transmitted, and the transmitted light is input into the photoelectric converter 40 in the substrate 12.

The on-chip lens 28 is formed on the upper face of the color filter layer 27. With the on-chip lens 28, the radiated light is collected, and the collected light is efficiently input into each photoelectric converter 40 via the color filter layer 27.

The wiring layer 13 is formed on the front face side of the substrate 12, and is configured to having multiple layers (three layer according to the present embodiment) of wiring 15 accumulated via the intra-layer insulating film 14. The pixel transistor Tr that configures the pixel 2 is driven via the wiring 15 formed on the wiring layer 13.

The supporting substrate 31 is formed on the face on the opposite side from the side of the wiring layer 13 that faces the substrate 12. The supporting substrate 31 herein is configured to secure the strength of the substrate 12 at the manufacturing state, and is configured with a silicon substrate, for example.

With the solid-state imaging device 1 having the above configurations, light is irradiated from the back face side of the substrate 12, and the light transmitting the on-chip lens 28 and color filter layer 27 is subjected to photoelectric conversion at the photoelectric converters 40, whereby a signal charge is generated. The signal charge generated at the photoelectric converters 40 is then output as a pixel signal by the vertical signal line formed with a desired wiring 15 in the wiring layer 13, via the pixel transistors formed on the front face side of the substrate 12.

1-3 Manufacturing Method of Solid-State Imaging Device

Next, a manufacturing method of the solid-state imaging device of the present embodiment will be described. FIG. 4 and FIG. 5 are cross-sectional diagrams illustrating a manufacturing process of the solid-state imaging device of the present embodiment.

First, as illustrated in A in FIG. 4, upon forming the photoelectric converters 40, pixel transistors, and pixel separating layer 18 on the substrate 12, the wiring layer 13 is formed by forming the intra-layer insulating film 14 and wiring 15 alternately on the front face of the substrate 12. The impurity region of the photoelectric converters 40 and so forth that are formed on the substrate 12 are formed by subjecting the desired impurity to ion injection from the front face side of the substrate 12.

Continuing, the supporting substrate 31 (see B in FIG. 4) made of a silicon substrate is adhered to the uppermost layer of the wiring layer 13 and inverted. The manufacturing process up to now is similar to a normal back face-projection type solid-state imaging device. Note that while omitted from the diagram, upon inverting the substrate 12, generally the substrate 12 is polished from the back face side and thinned to a desired thickness.

Next, as illustrated in B in FIG. 4, the border of each pixel on the substrate 12, i.e. in the portions where a pixel separating layer 18 is formed, etching is performed selectively in the depth direction from the back face side of the substrate 12, whereby forming a groove portion 39 of a desired depth.

In the process to form the groove 39, a hard mask (unshown) having a desired opening is formed on the back face of the substrate 12, and etching is performed via the hard mask thereof, thereby forming the groove portion. Considering spectral properties, it is favorable for the depth of the groove portion 39 to be 0.2 μm or greater from the back face of the substrate 12, and more favorable to be 1.0 μm or greater. Also, it is favorable for the width of the groove portion 39 to be 0.02 μm or greater, according to the spectral properties. Processing the groove portion 39 is easier by setting the width of the groove portion 39 to be wide, but the wider the width of the groove portion 39 is, the more the spectral properties and saturation charge amount decreases, and therefore it is desirable for the width of the groove portion 39 to be approximately 0.02 μm.

As illustrated in B in FIG. 4, with the present embodiment, a groove portion 39 is formed of a depth that reaches the p-well layer 29 of the pixel transistor, and that does not reach the floating diffusion portion 30 or the source/drain region. Note that the process to form the groove portion 39 can be shared with other substrate through processes and performed, and in the case of sharing, the number of processes may be reduced.

Next, the hard mask used to process the groove portion 39 is removed, and the fixed charge film 20 is formed so as to coat the side wall and base face of the groove portion 39 and the back face of the substrate 12, using a CVD method, sputtering method, ALD, or the like, as illustrated in C in FIG. 5. Subsequently, the insulating film 21 is formed to be embedded in the groove portion 39, using the CVD method, while forming the insulating film 21 on the upper face of the fixed charge film 20 on the back face side of the substrate 12.

Next, upon forming the light blocking material layer over the entire upper portion of the insulating film 21, the light blocking material layer thereof is patterned in a desired shape. Thus, the photoelectric converters 40 are opened as illustrated in D in FIG. 5, and the light blocking film 25 that blocks the light between adjacent pixel and pixel is formed.

Subsequently, by forming the color filter layer 27 and on-chip lens 28 with a normal method, the solid-state imaging device 1 illustrated in FIG. 2 is completed.

From the above, the solid-state imaging device 1 is formed, in which pixel separation is performed by the element separating unit 19 that is formed by the insulating film 21 being embedded in the substrate 12.

According to the solid-state imaging device 1 of the present embodiment, the photoelectric converters 40 of each pixel are separated by the element separating unit 19 that is formed by the insulating film 21 being embedded in the groove portion 39. Therefore, leaking of the signal charge accumulated in a photoelectric converter 40 to an adjacent photoelectric converter 40 side can be reduced more than with the case of separating only with an impurity region. Consequently, in the case that a signal charge that is greater than the saturation charge amount is generated in the photoelectric converter 40, the charge can be discharged to the floating diffusion portion 30 side more efficiently. Thus, the occurrence of blooming can be suppressed.

FIG. 6 illustrates a potential distribution at the time of charge accumulation, and is a diagram to describe a horizontal-type overflow configuration (lateral overflow configuration). A diagram of a potential distribution of two adjacent photoelectric converters 40 of the solid-state imaging device 1 of the present embodiment and the substrate 12 at a portion where the transfer transistor Tr1 is formed are illustrated in FIG. 6. Further, as a comparison example, a diagram of a potential distribution of a portion on a substrate where photoelectric converters and a transfer transistor of a conventional solid-state imaging device, where adjacent photoelectric converters that are separated only by the element separating region 100 formed by ion injection, are formed, are illustrated together in FIG. 6. In FIG. 6, portions corresponding to FIG. 2 have the same reference numerals appended thereto.

As illustrated in FIG. 6, with a conventional solid-state imaging device, in order to overflow a signal charge exceeding a saturation charge amount at the time of charge accumulation in the horizontal direction, the potential of the transfer gate is set deeper than the potential of the element separating region 100 between the two adjacent photoelectric converters 40. By doing so, the signal charge exceeding the saturation charge amount of the photoelectric converters 40 does not flow in the direction of the adjacent photoelectric converter 40, and is discharged through the transfer gate to the floating diffusion portion 30, and therefore has a configuration where blooming is suppressed.

Thus, in the case of utilizing a lateral overflow in a conventional solid-state imaging device, the depth needs to be set deeper than the potential of the element separating region 100 between the two adjacent photoelectric converters 40. Therefore, a predetermined potential has needed to be supplied to the transfer gate electrode at the time of charge accumulation, and the potential of the transfer gate set deep, whereby the saturation charge amount (Qs) has been decreased in the amount thereof.

On the other hand, the solid-state imaging device 1 of the present embodiment has the adjacent photoelectric converters 40 separated with the element separating unit 19. Thus, at the time of charge accumulation, even if the potential of the transfer gate is in a shallow state, the signal charge exceeding the saturation charge amount of the photoelectric converter 40 does not flow in the direction of the adjacent photoelectric converter 40, and is discharged to the floating diffusion unit 30.

According to the solid-state imaging device 1 of the present embodiment, the photoelectric converters 40 are separated with an element separating unit 19 that is configured with an insulating film 21, whereby, as compared to conventional art, the potential of the element separating unit 19 becomes shallow by an amount equivalent to $\Delta \times 1$. Therefore, the potential of the transfer gate at the time of charge accumulation does not have to be deep. As illustrated in FIG. 6, the potential of the transfer gate can be made shallow by an amount equivalent to $\Delta \times 2$, as compared to conventional art, and consequently with the solid-state imaging device 1 of the present embodiment, the saturation charge amount can be increased as compared to conventional art. In other words, with the solid-state imaging device 1 of the present embodiment, the saturation charge amount can be improved while suppressing blooming. Also, the electric field within the photoelectric converters 40 does not have to be increased because of the saturation property improvement, and the concentration of the n-type semiconductor region that configures the photoelectric converters 40 can be set low, so white spots can be maintained to a low level.

Also, with the solid-state imaging device 1 of the present embodiment, a solid charge film 20 having a negative charge is formed in the groove portion 39. Therefore, from a negative bias advantage of the fixed charge film 20, the occurrence of interface leveling can be suppressed, and the occurrence of dark current resulting from interface leveling can be suppressed. Further, an inversion layer (p-type) is formed on the face touching the fixed charge film 20, and a plus charge is induced. Therefore, even if the p-well layer 29 and pixel separating layer 18 configured with a p-type semiconductor region are formed with a p-type impurity concentration that is approximately one row thinner than a conventional solid-state imaging device, pixel separating functions and dark current suppressing advantages can be sufficiently exercised.

Also, with the present embodiment, the p-well layer 29 and pixel separating layer 18 can be formed with an impurity concentration that is thinner than a conventional solid-state imaging device, whereby the n-type semiconductor region 22 that makes up the photoelectric converters 40 is not eroded by the p-type semiconductor region. Thus, the saturation charge amount can be improved. Further, the p-type impurity concentration of the p-well layer 29 and pixel separating layer 18 can be set low, whereby the occurrence of a strong electrical field in the p-well layer 29 and pixel separating layer 18 can be suppressed, and noise occurrence can be suppressed.

Also, the element separating unit 19 is formed so as to touch the p-well layer 29 serving as a ground potential, whereby the inversion layer (p-type) formed in the periphery of the element separating unit 19 is fixed and pinned to the ground potential, and therefore, the occurrence of dark current is suppressed.

Further, with the solid-state imaging device 1 of the present embodiment, the element separating unit 19 can be formed on a region that overlaps on the pixel transistor and in the light input direction. Therefore, the element separating unit 19 can be formed without influencing the layout of the pixel transistor in any way, and a separate region for the element separating unit 19 does not have to be provided, so the pixel area does not increase greatly.

An example of four-pixel sharing, where a requisite pixel transistor is shared as to four photoelectric converters 40 is one unit, is described above, but should not be limited to this, and various types of configurations can be made, such as an example of two-pixel sharing as one unit or a case there pixel transistors are not shared, and so forth.

1-4 First Modified Example

As a solid-state imaging device relating to a first modified example of the present embodiment, an example will be described where two-pixel sharing, where a requisite pixel transistor is shared as to two photoelectric converters is one unit. FIG. 7 is a plan layout of the solid-state imaging device relating to the first modified example. In FIG. 7, portions corresponding to FIG. 3 will have the same reference numerals appended, and duplicative descriptions will be omitted.

In the first modified example, as illustrated in FIG. 7, the transfer transistor is configured of a floating diffusion portion 30 that is formed in the center portion of two photoelectric converters 40 formed as one row, two columns, and a transfer gate electrode 16. Also, of the pixel transistors, the reset transistor Tr2, amplifying transistor Tr3, and selecting transistor Tr4 are formed for every two photoelectric converters 40 that share a floating diffusion portion 30. These reset transistor Tr2, amplifying transistor Tr3, and selecting transistor Tr4 are disposed on one side of a group configured with the two photoelectric converters 40.

Also, in the case of two-pixel sharing, the element separating unit 19 is formed in a grid shape so as to surround the photoelectric converters 40 for each pixel, and is disposed in a region overlapping the pixel transistors when in a region where the pixel transistors are formed.

Also, the cross-sectional configuration including the transfer transistor Tr1 of the solid-state imaging device relating to the first modified example is similar to the configuration in FIG. 2.

According to a solid-state imaging device also where such two-pixel sharing is one unit, the photoelectric converters 40 of each pixel are insulated with the element separating unit 19, whereby the signal charge generated with the photoelectric converters 40 does not easily leak into the photoelectric converter 40 of the adjacent pixel. Therefore, similar advantages as the present embodiment can be obtained, such as blooming being able to be suppressed while saturation properties are maintained, and so forth.

1-5 Second Modified Example

As a solid-state imaging device relating to a second modified example of the present embodiment, an example will be described where a pixel transistor is formed for every photoelectric converter 40 of each pixel. FIG. 8 is a plan layout of the solid-state imaging device relating to the second modified example. In FIG. 8, portions corresponding to FIG. 3 will have the same reference numerals appended, and duplicative descriptions will be omitted.

In the second modified example, the transfer transistor Tr1, reset transistor Tr2, and amplifying transistor Tr3 are formed for each pixel, and a selecting transistor is not configured. Also, the pixel transistors formed for each photoelectric converter 40 are formed in one direction of the photoelectric converters 40. Also, the element separating unit 19 is formed in a grid shape so as to surround the photoelectric converters 40 for each pixel, and is disposed in a region where a portion overlaps the pixel transistors.

Also, the cross-sectional configuration of the solid-state imaging device relating to the second modified example will be omitted from the diagrams, but the solid-state imaging device in the second modified example has one floating diffusion portion 30 formed as to each photoelectric converter 40. In the second modified example also, the photoelectric converters 40 of each pixel are insulated with the element separating unit 19, so the signal charge generated by each photoelectric converter 40 does not easily leak into the photoelectric converter 40 of an adjacent pixel. Therefore, similar advantages as the present embodiment can be obtained, such as blooming being able to be suppressed while saturation properties are maintained, and so forth.

Thus, even in solid-state imaging devices having different layouts, the configuration of the element separating unit 19 as to the photoelectric converters 40 can have a similar configuration in either case.

2. Second Embodiment: Solid-State Imaging Device

Next, a solid-state imaging device relating to a second embodiment of the present disclosure will be described. The overall configuration of the solid-state imaging device of the present embodiment is similar to FIG. 1, so is omitted from the diagram illustration. FIG. 9 is a diagram illustrating a configuration of a cross-section of key portions of a solid-state imaging device 52 of the present embodiment. In FIG. 9, portions corresponding to FIG. 2 will have the same reference numerals appended thereto, and duplicative descriptions will be omitted.

The solid-state imaging device 52 of the present embodiment is an example having a configuration of an element separating unit 49 that is different from the first embodiment.

With the solid-state imaging device 52 of the present embodiment, the element separating unit 49 is configured with a fixed charge film 20, insulating film 48, and light blocking layer 50 that are embedded sequentially in the groove portion 39. The light blocking layer 50 is formed in the depth direction within the groove portion 39 wherein the fixed charge film 20 and insulating film 48 have been formed, and is configured so as to be connected to the light blocking film 25 that is formed on the back face side of the substrate 12.

A through C in FIG. 10 are cross-sectional diagrams illustrating a manufacturing process of the solid-state imaging device 52 of the present embodiment. With the present embodiment, the process up to forming the groove portion 39 is similar to the process described in A in FIG. 4 and B in FIG. 4, so the processes thereafter will be described.

Upon forming the groove portion 39 in the region surrounding the photoelectric converter 40, the fixed charge film 20 is formed so as to coat the inner wall face of the groove portion 39 and the back face side of the substrate 12, as illustrated in A in FIG. 10. The fixed charge film 20 herein is formed similar to the first embodiment. Next, the insulating film 48 is formed within the groove portion 39, and the back face side of the substrate 12, so as to coat the fixed charge film 20. At this time, the insulating film 48 that forms the groove portion 39 is formed to a thickness that does not fill in the entire groove portion 39. The insulating film 48 can be formed using a sputtering method, for example.

Next, as illustrated in B in FIG. 10, the light blocking material layer 24a is formed so as to coat the back face side of the substrate 12, while completely filling in the groove portion 39. The light blocking material layer 24a can be formed similar to the first embodiment, but in particular, it is favorable to use a material having good embedding properties.

Next, as illustrated in C in FIG. 10, the light blocking material layer 24a is patterned so that a light blocking material layer remains in the border portion between adjacent pixel and pixel. Thus, the light blocking layer 50 embedded in the groove portion 39 and the light blocking film 25 that is electrically connected to the light blocking layer 50 thereof are formed.

Subsequently, by forming the planarizing film 26, color filter layer 27, and on-chip lens 28, in sequence, using a normal manufacturing method, the solid-state imaging device 52 of the present embodiment is completed.

With the solid-state imaging device 52 of the present embodiment, a ground potential or a negative potential is supplied to the light blocking film 25 and light blocking layer 50. By supplying a ground potential or negative potential to the light blocking film 25 and light blocking layer 50, the effects of hole pinning on the front face of the element separating unit 19 can be stabilized. Also, in the case of supplying a negative potential to the light blocking film 25 and light blocking layer 50, it becomes easy for an inversion layer to be formed on the face of the substrate 12 that touches the element separating unit 19, and the effects of suppressing dark current can be increased.

Further, with the present embodiment, the light blocking layer 50 is formed within the groove portion 39, whereby the light that is diagonally incident can be prevented from entering in an adjacent photoelectric converter 40, and optical color mixing is suppressed. Otherwise, the same advantages as the first embodiment can be obtained.

3. Third Embodiment: Solid-State Imaging Device

Next, a solid-state imaging device relating to a third embodiment of the present disclosure will be described. The overall configuration of the solid-state imaging device of the present embodiment is similar to FIG. 1, so is omitted from the diagram illustration. FIG. 11 is a configuration diagram of a cross-section of key portions of a solid-state imaging device 55 of the present embodiment. In FIG. 11, portions corresponding to FIG. 2 will have the same reference numerals appended thereto, and duplicative descriptions will be omitted.

The solid-state imaging device 55 of the present embodiment is an example where the pixel separating layer 18, which is made of a p-type semiconductor region formed on the substrate 12 in the solid-state imaging device 1 relating to the first embodiment, is not formed. That is to say, with the solid-state imaging device 55 of the present embodiment, photoelectric converters 56 are separated by pixel with only the element separating unit 19. However, in this case also, the end portion on the front face side of the element separating unit 19 is formed so as to touch the p-well layer 29 of the pixel transistors.

With the solid-state imaging device 55 of the present embodiment, the photoelectric converters 65 are configured of a p-type semiconductor region 23 that is formed on the front face side of the substrate 12 and an n-type semiconductor region 51 that is formed from the lower portion of the p-type semiconductor region 23 to the back face side of the substrate 12. That is to say, with the present embodiment, the n-type semiconductor region 51 which is the charge accumulating region in the photoelectric converters 56 is formed to be large as compared to the n-type semiconductor region 22 which is the charge accumulating region of the photoelectric converters 40 in the first embodiment. Therefore, the saturation charge amount can be further improved.

With the present embodiment, a pixel separating layer to separate the photoelectric converters 56 of each pixel with a p-type impurity region and a p-type semiconductor region on the back face side of the substrate 12 for dark current suppression are not formed. However, the insulating film 20 having a negative fixed charge is formed on the element separating unit 19, whereby an inversion layer is formed on the face that touches the fixed charge film 20, and the occurrence of dark current can be suppressed. Thus, with a configuration where the end portions on the front face side of the substrate 12 of the element separating unit 19 touch the p-type semiconductor region such as the p-well layer 29 or the like which electrically separates the n-type semiconductor regions 51, leaking of charge between the photoelectric converters 56 can be sufficiently suppressed.

Otherwise, similar advantages as with the first embodiment can be obtained.

4. Fourth Embodiment: Solid-State Imaging Device

Next, a solid-state imaging device relating to a fourth embodiment of the present disclosure will be described. The overall configuration of the solid-state imaging device of the present embodiment is similar to FIG. 1, so is omitted from the diagram illustration. FIG. 12 is a configuration diagram of a cross-section of key portions of a solid-state imaging device 57 of the present embodiment. In FIG. 12, portions corresponding to FIG. 2 will have the same reference numerals appended thereto, and duplicative descriptions will be omitted.

The solid-state imaging device 57 of the present embodiment is an example where a portion of an element separating unit 59 passes through the substrate 12. As illustrated in FIG. 12, in regions where the pixel transistor (in FIG. 12, the floating diffusion portion 39 of the transfer transistor Tr1) is not overlapped, the element separating unit 59 is formed so as to pass through the substrate 12. That is to say, the element separating unit 19 in regions that do not overlap with the pixel transistor is configured with a fixed charge film 20 and insulating film 21 that are sequentially embedded within the groove portion 60 formed so as to pass through the substrate 12.

On the other hand, in a region that overlaps with the pixel transistor, similar to the first embodiment, the end portion on the front face side of the element separating unit 19 is formed so as to touch the p-well layer 29 of the pixel transistor. At this time, the end portion on the front face side of the element separating unit 19 is formed so as to not reach the floating diffusion portion 30 and source/drain region that make up the pixel transistor.

FIG. 13 and FIG. 14 are cross-sectional diagrams illustrating a manufacturing process of the solid-state imaging device 57 of the present embodiment. With the present embodiment, the process up to before forming groove portions 39 and 60 is similar to the process described in A in FIG. 4, so the processes thereafter will be described.

With the present embodiment, upon inverting the substrate 12, upon which the wiring layer 13 and support substrate 31 are formed, and thinning to a desired thickness, groove portions 39 and 60 which have different depths are formed, as illustrated in A in FIG. 13. In a region where the element separating unit 59 that passes through the substrate 12 is formed, the groove portion 60 that passes through the substrate 12 is formed, and in a region where the element separating unit 19 does not pass through is formed, the groove portion 39 is formed to a depth that reaches the p-well layer 29 of the pixel transistor. The groove portions 39 and 60 having different depths herein can be formed by performing etching processing that is divided into multiple stages.

Next, as illustrate in B in FIG. 13, by forming the fixed charge film 20 and insulating film 21 within the groove portions 39 and 60 having different depths, similar to C in FIG. 5, the element separating units 19 and 59 having different depths can be formed.

Subsequently, upon forming the light blocking material layer over the entire face of the upper portion of the insulating film 21, the light blocking material layer thereof is patterned into a desired shape. Thus, the photoelectric converters 40 are opened as illustrated in FIG. 14C, and the light blocking film 25 which blocks the light between adjacent pixel and pixel is formed.

Subsequently, by forming the color filter layer 27 and on-chip lens 28 with a normal method, the solid-state imaging device 57 illustrated in FIG. 12 is completed.

With the solid-state imaging device 57 of the present embodiment, in regions other than a region that overlaps the pixel transistor, the element separating unit 59 is formed so as to pass through the substrate 12, whereby leakage of the signal charge between adjacent photoelectric converters 40 can be further reduced. Thus, the advantage of suppressing the blooming can be increased. Additionally, similar advantages to the first embodiment can be obtained.

5. Fifth Embodiment: Solid-State Imaging Device

Next, a solid-state imaging device relating to a fifth embodiment of the present disclosure will be described. The overall configuration of the solid-state imaging device of the present embodiment is similar to FIG. 1, so is omitted from the diagram illustration. FIG. 15 is a configuration diagram of a cross-section of key portions of a solid-state imaging device 64 of the present embodiment. In FIG. 15, portions corresponding to FIG. 2 will have the same reference numerals appended thereto, and duplicative descriptions will be omitted.

The solid-state imaging device 64 of the present embodiment is an example of the solid-state imaging device 52 relating to the second embodiment, having an element separating unit 62 that passes through the substrate 12 in a portion (for example, an edge) of the pixel region, and forming a light blocking layer 63 that is exposed on the front face side of the substrate 12 within the element separating unit 62 thereof.

The element separating unit 62 that passes through the substrate 12 is configured of a groove portion 60 that is formed so as to pass through the substrate 12, and a fixed charge film 20, insulating film 48, and light blocking layer 63 which are formed sequentially within the groove portion 60 thereof, and the light blocking layer 63 is formed so as to be exposed on the front face side of the substrate 12. The light blocking layer 63 which is formed so as to be exposed on the front face side of the substrate 12 is connected to a desired wiring 15 via a contact portion 61 formed in the intra-layer insulating film 14 that makes up the wiring layer 13. A ground potential or negative potential is supplied from the wiring 15 to the light blocking layer 63 herein, whereby a ground potential or negative potential is supplied to the light blocking layer 50 and light blocking film 25 formed in the pixel region.

In the case of manufacturing the solid-state imaging device 64 of the present embodiment, first, similar to A in FIG. 13, groove portions 39 and 60 having different depths are formed, and next, similar to A in FIG. 10, the fixed charge film 20 and insulating film 48 are formed. Subsequently, only the fixed charge film 20 and insulating film 48 formed on the base face of the groove portion 60 that passes through the substrate 12 are removed by etch back. Also, the light blocking material is embedded in the groove portions 39 and 60 while the light blocking material is formed on the back face side of the substrate 12, while the wiring layer 13 is in an exposed state in the base face of the groove portion 60 that passes through the substrate 12, and by patterning into a desired shape, the light blocking layers 50 and 63 and the light blocking film 25 are formed. Thus, the light blocking layer 50 that passes through the substrate 12 can be drawn out to the wiring layer 13 side, and a desired potential can be supplied from the wiring 15 of the wiring layer 13 to the light blocking layer 50. Note that with the present embodiment, in the process to form the wiring layer 13, the contact portion 61 to connect to the light blocking layer 63 is formed beforehand.

With the solid-state imaging device 64 of the present embodiment, the light blocking layer 63 can be drawn out to the wiring layer 13 side of the substrate 12 by forming a portion of the element separating unit 62 to pass through the substrate 12. Also, electrical connection between the light blocking film 25 and light blocking layers 50 and 63 and the wiring 15, and manufacturing of the element separating units 19 and 62 can be performed in the same process, so the number of processes can be reduced.

Additionally, similar advantages as the solid-state imaging devices relating to the first and second embodiments can be obtained.

6. Sixth Embodiment: Solid-State Imaging Device

Next, a solid-state imaging device relating to a sixth embodiment of the present disclosure will be described. The overall configuration of the solid-state imaging device of the present embodiment is similar to FIG. 1, so is omitted from the diagram illustration. FIG. 16 is a configuration diagram of a cross-section of key portions of a solid-state imaging device 41 of the present embodiment. In FIG. 16, portions corresponding to FIG. 2 will have the same reference numerals appended thereto, and duplicative descriptions will be omitted.

The configuration of an element separating unit 42 of the solid-state imaging device 41 of the present embodiment differs from the first embodiment. With the present embodiment, the element separating unit 42 has a first fixed charge film 43, second fixed charge film 44, first insulating film 45, and second insulating film 46, formed so as to be embedded in sequence in the groove portion 39. Note that with the present embodiment, the side faces of the groove portion 39 are formed in a tapered shape, and the opening diameter is small in the depth direction of the substrate 12. Each film formed in the groove portion 39 and on the back face of the substrate 12 will be described below, together with the manufacturing methods thereof.

The first fixed charge film 43 is formed so as to coat the inner wall face of the groove portion 39 and the back face of the substrate 12, and is formed using a CVD method or ALD method. As to material to form the first fixed charge film 43, similar material as the material of the fixed charge film 20 in the first embodiment can be used.

In the case of using a CVD method or ALD method to form the first fixed charge film 43, a SiO2 film to reduce the interface level while forming the film is formed simultaneously. It is favorable for the SiO2 film herein to be formed in a thickness of approximately 1 nm. In the case of removing the thickness of the SiO2 film formed at the substrate interface herein, it is favorable for the first fixed charge film 43 to be formed in a thickness of 3 nm or greater, and for example, it is favorable to be formed as 3 nm or greater and 20 nm or less.

The second fixed charge film 44 is formed within the groove portion 39 and on the back face of the substrate 12 so as to coat the first fixed charge film 43, and is formed using a PVD (Physical Vapor Deposition) method, for example. As to material to form the second fixed charge film 44, similar material as the material of the fixed charge film 20 in the first embodiment can be used, similar to the first fixed charge film 43. Also, the second fixed charge film 44 may be formed with the same material as the first fixed charge film 43, or may be formed with a different material.

It is favorable for the second fixed charge film 44 to be formed in a thickness of 40 nm or more and 60 nm or less, for example, on the back face of the substrate 12. By forming the second fixed charge film 44 in a thickness of 40 nm or more and 60 nm or less, advantages of pinning on the back face side of the substrate 12 and advantages of a later-described reflection inhibiting film can be securely obtained.

The first insulating film 45 is formed within the groove portion 39 and on the back face of the substrate 12 so as to coat the second fixed charge film 44, and is formed as an anisotropic oxide film formed with a PVD method or VCD method, and for example, is formed with an oxide film including TEOS (Tetra Ethyl Ortho Silicate) material or silane material. It is favorable for the first insulating film 45 to be formed in a thickness of 0 nm or greater and 600 nm or less, for example, on the back face of the substrate 12.

The second insulating film 46 is formed within the groove portion 39 and on the back face of the substrate 12 so as to coat the first insulating film 45, and in the present embodiment is formed as an isotropic oxide film formed with an ALD method or CVD method, and for example, is formed with a silicon oxide film or the like. With the present embodiment, the groove portion 39 is completely filled in with the second insulating film 46. Also, it is favorable for the second insulating film 46 to be formed in a thickness of 0 nm or greater and 300 nm or less, for example, on the back face of the substrate 12, and the film thickness of the first insulating film 45 and second insulating film 46 together is formed to be 10 nm or greater and 900 nm or less, and it is favorable to be 50 nm or greater and 700 nm or less, and more favorable to be 100 nm or greater and 500 nm or less.

Also, the layered film made up of the first fixed charge film 43, second fixed charge film 44, first insulating film 45, and second insulating film 46 that is formed on the back face side of the substrate 12 and within the groove portion 39 also serves to function as a reflection inhibiting film.

Note that with the present embodiment, a case of forming a two-layer insulating film of the first insulating film 45 and second insulating film 46 is described, but the present disclosure is not limited to this, and it is sufficient if one of the first and second insulating films 45 and 46 is formed. Also, a case of forming an anisotropic film as the first insulating film 45 and an isotropic film as the second insulating film 46 is described, but the reverse may be the case.

Further, the inner periphery face of the groove portion 39 may have a configuration where all or a portion of the first fixed charge film 43, second fixed charge film 44, first insulating film 45, and second insulating film 46 are layered, or may have a configuration where none of the above-mentioned films are layered.

7. Seventh Embodiment: Solid-State Imaging Device

Next, a solid-state imaging device relating to a seventh embodiment of the present disclosure will be described. The overall configuration of the solid-state imaging device of the present embodiment is similar to FIG. 1, so is omitted from the diagram illustration. FIG. 17 is a configuration diagram of a cross-section of key portions of a solid-state imaging device 47 of the present embodiment. In FIG. 17, portions corresponding to FIG. 2 will have the same reference numerals appended thereto, and duplicative descriptions will be omitted.

The solid-state imaging device 47 of the present embodiment differs from the first embodiment from the point that the element separating unit 53 has a hollow construction. With the present embodiment, as illustrated in FIG. 17, the element separating unit 53 has a fixed charge film 20 and insulating film 54 that are formed embedded in sequence in the groove portion 39 which is formed in the depth direction from the back face side of the substrate 12, and a hollow portion (a so-called void) 58 is formed within the groove portion 39.

The insulating film 54 is formed so as to coat the fixed charge film 20 that is formed on the inner wall face of the groove portion 39 and on the back face of the substrate 12. Also, in order to form the hollow portion 58 in the groove portion 39, the insulating film 54 is formed in a thickness so that the entire groove portion 39 is not filled in within the groove portion 39, and is formed so as to close off the groove portion 39 at the opening end of the groove portion 39. The insulating film 54 can be formed with a material similar to the material of the insulating film 21 used in the first embodiment.

A manufacturing process of the solid-state imaging device 47 of the present embodiment is illustrated in A in FIG. 18 and B in FIG. 18. The processes up to forming the groove portion 39 are similar to the first embodiment, so duplicative descriptions will be omitted. Upon forming the groove portion 39, as illustrated in A in FIG. 18, the fixed charge film 20 is formed so as to coat the inner periphery face and base face of the groove portion 39 and the back face of the substrate 12, using a CVD method, sputtering method, or ALD method or the like.

Next, as illustrated in B in FIG. 18, the insulating film 54 is formed so as to coat the fixed charge film 20 that is formed on the inner wall face of the groove portion 39 and the back face of the substrate 12, using a CVD method, sputtering method, coating method, or the like. With the film forming process of the insulating film 54 herein, a film forming condition is set so that, the before the inner portion of the groove portion 39 is completely filled in with the insulating film 54, the opening end side of the groove portion 39 is closed off. Thus, by optimizing the film forming condition, the element separating unit 53 having a hollow portion 58 as illustrated in B in FIG. 18 can be formed.

The inner portion of the hollow portion 58 formed in the element separating unit 53 may be in a state filled by air, or may be in a vacuum state. Also, in order to prevent light from mixing in at portions near the incident side, having a hollow portion exist in the upper portion (light input side) from the silicon face of the back face (interface between the substrate 12 and fixed charge film 20) is more favorable.

Subsequently, with a process similar to the first embodiment, the solid-state imaging device 47 of the present embodiment illustrated in FIG. 17 is completed. With the present embodiment, the refractive index of the hollow portion 58 is 1, and the refractive index of the fixed charge film 20 and insulating film 54 are each 1 or greater, whereby light reflection easily occurs at the element separating unit 53, and optical color mixing can be suppressed. Thus, with the present embodiment, optical light blocking properties can be improved in the element separating unit 53. Also, with the present embodiment, similar advantages as the first embodiment can be obtained.

With the present embodiment, the fixed charge film 20 is formed at the element separating unit 53, but the fixed charge film 20 does not have to be formed. In this case also, as material to form the insulating film, an insulating material having a refractive index of 1 or greater is used, and the insulating film is formed so as to form a hollow portion within the groove portion 39, whereby optical light blocking features can be improved and optical color mixing can be suppressed.

8. Eighth Embodiment: Solid-State Imaging Device

Next, a solid-state imaging device relating to a eighth embodiment of the present disclosure will be described. The overall configuration of the solid-state imaging device of the present embodiment is similar to FIG. 1, so is omitted from the diagram illustration. FIG. 19 is a configuration diagram of a cross-section of key portions of a solid-state imaging device 65 of the present embodiment. In FIG. 19, portions corresponding to FIG. 2 will have the same reference numerals appended thereto, and duplicative descriptions will be omitted.

The solid-state imaging device 65 of the present embodiment is the same as the seventh embodiment from the point that the element separating unit 66 has a hollow construction, but differs in the film configuration of the element separating unit 66 and the film forming method thereof. With the present embodiment, as illustrated in FIG. 19, the element separating unit 66 has a first film 67 and second film 68 that are formed embedded in sequence within the groove portion 39 that is formed in the depth direction from the back face side of the substrate 12, and a hollow portion 58 is formed within the groove portion 39.

The first film 67 is formed so as to coat the inner wall face of the groove portion 39 and the back face of the substrate 12, and the second film 68 is formed on the inner wall face of the groove portion 39 and the back face of the substrate 12 so as to layer over the first film 67. Also, with the groove portion 39, the opening end side of the groove portion 39 is closed off by the first film 67 and second film 68, in the case of a hollow portion 58 having been formed therein.

Although described later, the first film 67 is formed with an anisotropic film forming method, and is provided so as to narrow the opening diameter on the opening end side of the groove portion 39. On the other hand, the second film 68 is formed with an isotropic film forming method, and is provided so as to close off the opening end of the groove portion 39 that has been narrowed by the first film 67.

The first film 67 and second film 68 can be forming using an insulating material such as silicon oxide, silicon nitride, silicon oxynitride, resin, and the like, for example. Also, the first film 67 and second film 68 may be formed with the same material, or may be formed with different material. In the case of forming the first film 67 and second film 68 with different materials, it is favorable to select materials each having conditions where the film stress of the first film 67 is smaller than the film stress of the second film 68, and where the refractive index of the first film 67 is greater than the refractive index of the second film 68. The present embodiment is described for a case where, as an example, both the first film 67 and second film 68 are formed with a silicon oxide.

A manufacturing process of the solid-state imaging device 65 of the present embodiment is illustrated in A in FIG. 20 and B in FIG. 20. The process up to forming the groove portion 39 is similar to the first embodiment so duplicative descriptions will be omitted. Upon forming the groove portion 39, the first film 67 made of silicon oxide is formed, as illustrated in A in FIG. 20. The first film 67 is formed using an anisotropic film forming method, for example a plasma CVD method or PVD method.

The first film 67 is formed to be anisotropic, so the film thickness of the first film 67 at the base face of the groove portion 39 and back face of the substrate 12 is thicker than the film thickness of the first film 67 of the inner periphery face of the groove portion 39. Therefore, from the differences in the film forming rate on the back face of the substrate 12 and inner periphery face of the groove portion 39, the first film 67 has an overhang shape at the opening end side of the groove portion 39, and the opening diameter of the opening end side of the groove portion 39 is smaller than the opening diameter of the base face side of the groove portion 39, as illustrated in A in FIG. 20. Here, the first film 67 is formed to a thickness that does not completely close off the groove portion 39.

Next, as illustrated in B in FIG. 20, the second film 68 made of silicon oxide is formed. The second film 68 is formed using an isotropic method, an ALD method for example. The second film 68 is formed to be isotropic, so the second film 68 is formed at approximately the same thickness on top of the first film 67, on the inner wall face of the groove portion 39 and the back face of the substrate 12.

Also, the second film 68 is formed to a thickness to close off the groove portion 39 at the opening end side of the groove portion 39. With the present embodiment, because of the first film 67, the opening diameter on the opening end side of the groove portion 39 is narrower than the opening diameter on the base face side of the groove portion 39. Accordingly, the opening end side is closed off in a state of maintaining a hollow construction in the groove portion 39. Thus, a hollow portion 58 is formed within the groove portion 39. Also, even if the first film 67 is switched to an isotropic film, and the second film 68 is switched to an anisotropic film, the opening end side can be closed off in a state of maintaining a hollow construction of the groove portion 39. According to the present embodiment also, in order to prevent light mixing in at a portion near the incident side, it is favorable for the hollow portion to exist up to upwards (light input side) from the silicon face of the back face (interface between the substrate 12 and the first film 67).

Subsequently, from the process that is similar to the first embodiment, the solid-state imaging device 65 of the present embodiment illustrated in FIG. 19 is completed. According to the present embodiment also, the hollow portion 58 is formed in the element separating unit 66, whereby similar advantages as the seventh embodiment can be obtained.

With the present embodiment, an example is given of forming the element separating unit 66 with a two-layer film of the first film 67 and second film 68, but three or more layers of film may be formed as necessary. As in the present embodiment, in the case of forming the element separating unit 66 with two or more layers of film, if the stress of the film material to be formed first is lower as compared to the stress of the film material to be formed later, the stress to the substrate 12 can be suppressed, and dark current and white spots that result from stress can be suppressed. Further, by having the refractive index of the film material to be formed later to be lower as compared to the refractive index of the film material to be formed first, optical color mixing can be suppressed.

Also, according to the present embodiment also, a film having a negative fixed charge (corresponds to the fixed charge film 20 in FIG. 2) may be formed between the first film 67 and substrate 12. As a fixed charge film, similar material as the first embodiment can be used.

Further, the second film 68 may be formed with a metallic material such as tungsten (W), aluminum (Al), titanium (Ti), or the like, or an oxide or nitride thereof. In the case of forming the second film 68 with a metallic material, the metallic material film formed on the light input side of the photoelectric converters 40 has to be removed. A case of forming the first film 67 with a silicon oxide and forming the second film 68 with a metallic material will be described below as a modified example.

8-1 Modified Example

FIG. 21 is a cross-sectional configuration diagram of a solid-state imaging device 70 relating to a modified example. Portions in FIG. 21 that correspond to FIG. 19 have the same reference numerals appended thereto, and duplicative descriptions will be omitted. With the solid-state imaging device 70 relating to the modified example, a second film 71 that configures an element separating unit 72 differs from the present embodiment.

With the modified example, the second film 71 is formed of tungsten (W), for example, and is formed so as to coat the first film 67 in the inner wall face of the groove portion 39 and the light blocking region on the back face side of the substrate 12. That is to say, on the back face side of the substrate 12, the second film 71 is formed on a region corresponding to the position where the light blocking film 25 is formed, and is provided in a grid shape so as to open the photoelectric converters 40.

According to the modified example also, similar to the present embodiment, the second film 71 is formed on the front face of the first film 67, using an isotropic film forming method. Also, upon forming the light blocking material layer to be the blocking film 25 over the entire face on the upper portion of the second film 71 on the back face side of the substrate 12, the light blocking material layer thereof and the second film 71 are simultaneously patterned, whereby the second film 71 on the upper portions of the photoelectric converter 40 is removed. Subsequently, with a process similar to the first embodiment, the solid-state imaging device 70 illustrated in FIG. 21 can be manufactured.

As illustrated in the modified example, in the case of forming the film that is formed within the groove portion 39 using a metallic material, patterning is performed simultaneously with the patterning process of the light blocking film 25 that is formed on the back face side of the substrate 12, whereby the metallic material on the upper portion of the photoelectric converter 40 can be removed. Also, with the modified example, forming the light blocking film 25 is exemplified, but in the case that light can be blocked sufficiently with only the second film 71, the light blocking film 25 does not have to be separately provided. In this case, the number of film layers formed on the light input face side of the substrate 12 can be reduced, whereby the distance between the front face of the on-chip lens 28 and the substrate 12 can be shortened, and the sensitivity can be improved.

Also, the configuration of the solid-state imaging device 70 relating to the modified example, similar to the second embodiment, may supply a ground potential or negative potential to the second film 71 that is made of metallic material. By supplying a ground potential or negative potential to the second film 71, the advantages of hole pinning on the front face of the element separating unit 72 can be stabilized, and dark current can be suppressed.

With the seventh embodiment and eighth embodiment, the opening end side of the groove portion 39 is closed off by a film formed within the groove portion 39, but closing the hollow portion 58 within the groove portion 39 with a film formed on the back face side of the substrate 12 is sufficient. Accordingly, the open end side of the groove portion 39 does not necessarily have to be closed off with the film formed within the groove portion 39.

With the solid-state imaging device relating to the first through eighth embodiments above, the description is of a CMOS-type solid-state imaging device as an example, but a back face-projection type CCD-type solid-state imaging device may also be applicable. In this case also, by forming the element separating unit that electrically separates the photoelectric converters by embedding an insulating film in the groove portion formed from the face on the opposite side from the light input side, advantages similar to the advantages of the above-described first through fifth embodiments can be obtained.

Also, the configuration of the solid-state imaging device relating to the first through eighth embodiments is set to that the signal charge overflowing into the floating diffusion portion is overflowed, as a lateral overflow configuration. However, the present disclosure is not to be limited to such a configuration, and a configuration may be made to have the overflow into the source/drain region of other pixel transistors. For example, a configuration may have the signal charge overflowing into a region where VDD potential is supplied, such as the drain region of the reset transistor, to overflow.

Also, with the solid-state imaging device relating to the first through eighth embodiments, a configuration is illustrated of a case using a negative charge (electron) as the signal charge, but the present disclosure may be applied in the case also of using a positive charge (hole) as the signal charge. In the case of using a hole as a signal charge, using a material having a positive fixed charge as the fixed charge film is sufficient, and also, configuring the p-type region and n-type region within the substrate in reverse is sufficient. That is to say, using a material with a fixed charge that is the same charge as the signal charge as the fixed charge film is sufficient.

Also, as the element separating unit, the configuration is given as forming a fixed charge film in the groove portion, and further, embedding the insulating film, but the configuration of the present disclosure stands also as a configuration where only the fixed charge film is embedded in the groove portion. Also, the first through eighth embodiments may be appropriately combined. Also, with the first through eighth embodiments, the element separating unit is formed in a grid shape that surrounds the photoelectric converters, but besides a grid shape, various types of configurations can be made.

Also, the present disclosure is not restricted to application to a solid-state imaging device that detects the distribution of the amount of incident light that is visible light as an image, and images this, and application may be made also to a solid-state imaging device that images a distribution of infrared rays or X-rays, or an input quantity such as particles or the like, as an image. In a wide sense of the meaning, application can be made as to all solid-state imaging devices (physical quantity distribution detecting devices) such as a fingerprint detecting sensor or the like that detects the distribution of other physical quantities such as pressure and capacitance, and images this as an image.

Further, the present disclosure is not to be limited to a solid-state imaging device that scans each unit pixel in an image region in row increments sequentially and reads out pixel signals from each pixel unit. Application can also be made as to an X-Y address type of solid-state imaging device that selects optional pixels in pixel increments, and reads out a signal from the selected pixels in pixel increments.

Note that the solid-state imaging device made be arranged in a one-chip form, or may be arranged in a module form having a pixel region and a signal processing unit or optical system packaged together as an imaging function.

Also, the present disclosure is not to be limited to application to a solid-state imaging device, but can also be applied to an imaging apparatus. Here, an imaging apparatus refers to a camera system such as a digital still camera or video camera or the like, and an electronic device having an imaging function such as a cellular phone. Note that there are cases wherein the above-mentioned module form which is installed on electronic devices, i.e. a camera module, may be an imaging device.

9. Ninth Embodiment: Electronic Device

Next, an electronic device relating to a ninth embodiment of the present disclosure will be described. FIG. 22 is a schematic configuration diagram of an electronic device 200 relating to the ninth embodiment of the present disclosure.

The electronic device 200 relating to the present embodiment has a solid-state imaging device 203, optical lens 201, shutter device 202, driving circuit 205, and signal processing circuit 204. The electronic device 200 of the present embodiment illustrates an embodiment in the case of using the solid-state imaging device 1 in the first embodiment of the present disclosure described above as the solid-state imaging device 203 in an electronic device (camera).

The optical lens 201 forms an image from the image light (incident light) from a subject on an imaging face of the solid-state imaging device 203. From this the signal charge is accumulated within the solid-state imaging device 203 for a fixed time period. The shutter device 202 controls the time period for light radiating and time period for light blocking to the solid-state imaging device 203. The driving circuit 205 supplies a driving signal to control the transfer operation of the solid-state imaging device 203 and the shutter operation of the shutter device 202. Signal transferring of the solid-state imaging device 203 is performed with the driving signal (timing signal) supplied from the driving circuit 205. The signal processing circuit 204 performs various types of signal processing. A picture signal subjected to signal processing is stored in a storage medium such as a memory, or is output to a monitor.

With the electronic device 200 of the present embodiment, suppression of blooming and improvements to saturation properties can be made in the solid-state imaging device 203, whereby image quality can be improved.

As an electronic device 200 to which the solid-state imaging device 1 can be applied is not limited to a camera, and may be applied to a digital still camera, and further to an imaging device such as a camera module for mobile devices such as a cellular phone or the like.

According to the present embodiment, the solid-state imaging device 1 in the first embodiment is configured to be used as the solid-state imaging device 203 for the electronic device, but a solid-state imaging device manufactured as in the second through eighth embodiments may also be used.

Note that the present disclosure may also take a configuration such as the following.

(1)
A solid-state imaging device including:
a substrate;
multiple photoelectric converters formed on the substrate;
a groove portion provided in the depth direction from the light input side on the substrate; and
an element separating unit provided with an insulating film having a fixed charge, which is formed so as to coat the inner wall face of the groove portion.

(2)
The solid-state imaging device according to (1), wherein the element separating unit is formed in a grid shape so as to surround each photoelectric converter.

(3)
The solid-state imaging device according to either (1) or (2), wherein a light blocking layer is further formed within the groove portion.

(4)
The solid-state imaging device according to any one of (1) through (3), wherein the end portion of the light input side of the element separating unit is formed so as to touch a well layer on which a pixel transistor on the front face side of the substrate is formed.

(5)
The solid-state imaging device according to one of (1) through (4), wherein a region touching a side face of the element separating unit has the same conductivity type as a semiconductor region making up a charge accumulating unit of the photoelectric converter.

(6)
The solid-state imaging device according to any one of (1) through (5), wherein a portion of the element separating unit is formed so as to pass through the substrate.

(7)
The solid-state imaging device according to any one of (3) through (6), wherein a portion of the element separating unit is formed so as to pass through the substrate, and wherein the light blocking layer passes through the substrate and is connected to a wiring layer formed on the front face side of the substrate.

(8)
The solid-state imaging device according to any one of (1) through (7), wherein the light blocking layer is formed on the back face side of the substrate, and is electrically connected to the light blocking film which blocks light in the interface region between adjacent photoelectric converters.

(9)
The solid-state imaging device according to any one of (1) through (8), wherein the fixed charge film is formed within the groove portion, while being formed so as to coat the back face of the substrate.

(10)
The solid-state imaging device according to any one of (1) through (9), wherein the element separating unit further provides an insulating film embedded within the groove portion.

(11)
The solid-state imaging device according to any one of (1) through (10), wherein the fixed charge film is formed of multiple layers of film.

(12)
A solid-state imaging device comprising:
a substrate;
multiple photoelectric converters formed on the substrate;
a groove portion formed in the depth direction from the light input side on the substrate; and an element separating unit having a film that is provided so as to coat the inner wall face of the groove portion, and having a hollow construction.

(13)

The solid-state imaging device according to (12), wherein the element separating unit has a film that is two or more layers formed in sequence from the inner wall face side of the groove portion.

(14)

The solid-state imaging device according to (13), wherein, in the element separating unit, a film formed with a material having a greater absolute stress value is disposed at a position farther away from the inner face side of the groove portion.

(15)

The solid-state imaging device according to (13) or (14), wherein, in the element separating unit, a film formed with a material having a smaller refractive index is disposed at a position farther away from the inner face side of the groove portion.

(16)

The solid-state imaging device according to any one of (12) through (15), wherein a film touching the inner wall face of the groove portion is an insulating film having a fixed charge.

(17)

The solid-state imaging device according to any one of (12) through (16), wherein the film is formed with an insulating material or metallic material.

(18)

The solid-state imaging device according to any one of (13) through (16), wherein the element separating unit has a layered film of a film of one or more layers made of an insulating material and a film of one or more layers made of a metallic material.

(19)

The solid-state imaging device according to either (17) or (18), wherein the insulating material is silicon oxide, silicon nitride, or silicon oxynitride.

(20)

The solid-state imaging device according to (17) through (19), wherein the metallic material is tungsten, aluminum, titanium, or an oxide or nitride thereof.

(21)

A manufacturing method of a solid-state imaging device, including a process to form multiple pixels having photoelectric converters on a substrate;

a process to form a groove portion of a desired depth in the depth direction from the back face side of the substrate; and a process to form an insulating film having a fixed charge on the inner wall face of the groove portion, and forming an element separating unit.

(22)

The manufacturing method of a solid-state imaging device according to (21), wherein the element separating unit is formed in a grid shape so as to surround each photoelectric converter.

(23)

The manufacturing method of a solid-state imaging device according to either (21) or (22), wherein a light blocking layer is further formed within the groove portion.

(24)

The manufacturing method of a solid-state imaging device according to any one of (21) through (23), wherein the end portion of the light input side of the element separating unit is formed so as to touch a well layer on which a pixel transistor on the front face side of the substrate is formed.

(25)

The manufacturing method of a solid-state imaging device according to any one of (21) through (24), wherein a region touching a side face of the element separating unit is the same conductivity type as a semiconductor region making up a charge accumulating unit of the photoelectric converter.

(26)

The manufacturing method of a solid-state imaging device according to any one of (21) through (25), wherein a portion of the element separating unit is formed so as to pass through the substrate.

(27)

The manufacturing method of a solid-state imaging device according to any one of (21) through (26), wherein a portion of the element separating unit is formed so as to pass through the substrate, and wherein the light blocking layer passes through the substrate and is connected to a wiring layer formed on the front face side of the substrate.

(28)

The manufacturing method of a solid-state imaging device according to any one of (21) through (27), wherein a light blocking material layer is formed within the groove portion;

wherein a light blocking material layer is formed to coat the back face side of the substrate; and wherein, by patterning the light blocking material layer formed on the back face side of the substrate, a light blocking layer, and a light blocking film that is connected to the light blocking layer and that blocks light in the interface region between adjacent photoelectric converters, are formed.

(29)

The manufacturing method of a solid-state imaging device according to any one of (21) through (28), wherein the fixed charge film is formed within the groove portion, while being formed so as to coat the back face of the substrate.

(30)

A manufacturing method of a solid-state imaging device, including:

a process to form multiple pixels having photoelectric converters on a substrate;

a process to form a groove portion of a desired depth in the depth direction from the back face side of the substrate; and a process to form an element separating unit by forming a film that is a desired film on the inner wall face of the groove portion so that a hollow portion is formed within the groove portion.

(31)

A manufacturing method of a solid-state imaging device, according to (30), wherein multiple films are formed using an anisotropic film forming method and an isotropic film forming method in the process to form the element separating unit.

(32)

A manufacturing method of a solid-state imaging device, according to (30) or (31), wherein the anisotropic film forming method is a CVD method or a PVD method, and the isotropic film forming method is an ALD method.

(33)

An electronic device, comprising:
an optical lens;
a solid-state imaging device into which light collected in the optical lens is input, including
a substrate, multiple photoelectric converters formed on the substrate, a groove portion formed in the depth direction from the light input side on the substrate, and an element separating unit having a fixed charge film that has a fixed charge, which is formed so as to coat the inner wall face of the groove portion; and
a signal processing circuit to process an output signal output from the solid-state imaging device.

1, 52, 55, 57, 64 solid-state imaging device
2 pixel
3 pixel region
4 vertical driving circuit
5 column signal processing circuit
6 horizontal driving circuit
7 output circuit
8 control circuit
10 horizontal signal line
11, 12 substrate
13 wiring layer
14 intra-layer insulating film
15 wiring
16 transfer gate electrode
17 gate insulating film
18 pixel separating layer
19 element separating unit
20 fixed charge film
21 insulating film
22 n-type semiconductor region
23, 24 p-type semiconductor region
25 light blocking film
26 planarizing film
27 color filter layer
28 on-chip lens
29 p-well layer
30 floating diffusion unit
31 supporting substrate
32 reset gate electrode
33 amplifying gate electrode
34 selecting gate electrode
35, 36, 37 source/drain region
39, 60 groove portion
40 photoelectric converter
48 insulating film
49 element separating unit
50 light blocking layer
51 n-type semiconductor region
51 light blocking material layer
52 solid-state imaging device
200 electronic device
201 optical lens
202 shutter device
203 solid-state imaging device
204 signal processing circuit
205 driving circuit

What is claimed is:
1. A solid-state imaging device comprising:
a semiconductor substrate;
a first photoelectric converter in the semiconductor substrate;
a second photoelectric converter in the semiconductor substrate;
a third photoelectric converter in the semiconductor substrate;
a first groove portion disposed between the first and second photoelectric converters in a cross-section view, wherein the first groove portion extends in a depth direction of the semiconductor substrate and includes a first portion of a first insulating film having a fixed charge; and;
a second groove portion disposed between the second and third photoelectric converters in the cross-section view, wherein the second groove portion extends in the depth direction of the semiconductor substrate and includes a second portion of the first insulating film,
wherein,
a second insulating film is disposed over the first insulating film between the first and second photoelectric converters, and
a depth of the first groove portion is deeper than a depth of the second groove portion in the cross-section view.

2. The solid-state imaging device according to claim 1, wherein the second insulating film includes silicon oxide, silicon nitride, or silicon oxynitride.

3. The solid-state imaging device according to claim 1, wherein the first insulating film includes an oxide or nitride material including at least one of the elements of hafnium (Hf), aluminum (Al), zirconium (Zr), tantalum (Ta), titanium (Ti), Lanthanum (La), Praseodymium (Pr), Cerium (Ce), Neodymium (Nd), Promethium (Pm), Samarium (Sm), Europium (Eu), Gadolinium (Gd), Terbium (Tb), Dysprosium (Dy), Holmium (Ho), Thulium (Tm), Ytterbium (Yb), Lutetium (Lu), or Yttrium (Y).

4. The solid-state imaging device according to claim 1, wherein the first insulating film includes hafnium oxide.

5. The solid-state imaging device according to claim 1, wherein the second insulating film includes silicon oxide.

6. The solid-state imaging device according to claim 1, wherein the semiconductor substrate includes a first side that is a light-incident side and a second side opposite to the first side, and wherein a wiring layer is disposed at the second side of the semiconductor substrate.

7. The solid-state imaging device according to claim 6, further including a light-blocking film disposed at the first side of the semiconductor substrate.

8. The solid-state imaging device according to claim 7, further comprising:
a planarizing film disposed above the light-blocking film.

9. The solid-state imaging device according to claim 7, further comprising:
a color filter disposed above the light-blocking film.

10. The solid-state imaging device according to claim 9, further comprising:
an on-chip lens disposed above the color filter.

11. The solid-state imaging device according to claim 6, wherein the first groove portion is formed at a depth that reaches a p-type region formed on the second side of the semiconductor substrate.

12. The solid-state imaging device according to claim 1, wherein the first groove portion is formed at a depth that reaches a p-type region formed on a front side of the semiconductor substrate.

13. The solid-state imaging device according to claim 1, further comprising:
a floating diffusion unit, wherein the first photoelectric converter is coupled to the floating diffusion unit, and wherein the floating diffusion unit is coupled to a reset transistor and amplification transistor.

14. The solid-state imaging device according to claim 13, wherein the floating diffusion unit, the amplification transistor, and the reset transistor are shared by the first and second photoelectric converters.

15. The solid-state imaging device according to claim 13, further comprising:
a selecting transistor coupled to the amplification transistor.

16. The solid-state imaging device according to claim 15, further comprising:
a signal line coupled to the selecting transistor.

17. The solid-state imaging device according to claim 16, further comprising:
a transfer transistor coupled to the first photoelectric converter, wherein the transfer transistor includes a transfer gate electrode disposed between the first photoelectric converter and the floating diffusion unit.

18. The solid-state imaging device according to claim 17, wherein the transfer gate electrode is disposed between the first photoelectric converter and the floating diffusion unit in a diagonal direction.

19. The solid-state imaging device according to claim 1, further comprising:
an element separating unit surrounding the second photoelectric converter, wherein the element separating unit includes the first portion of the first insulating film and the second insulating film.

20. The solid-state imaging device according to claim 1, further comprising:
a light-blocking film disposed above at least a portion of the first groove portion.

21. The solid-state imaging device according to claim 1, further comprising:
a floating diffusion unit, wherein the first groove portion is disposed above the floating diffusion unit.

22. An electronic apparatus comprising:
a solid-state imaging device including:
  a semiconductor substrate,
  a first photoelectric converter in the semiconductor substrate,
  a second photoelectric converter in the semiconductor substrate,
  a third photoelectric converter in the semiconductor substrate,
  a first groove portion disposed between the first and second photoelectric converters in a cross-section view, wherein the first groove portion extends in a depth direction of the semiconductor substrate and includes a first portion of a first insulating film having a fixed charge, and
  a second groove portion disposed between the second and third photoelectric converters in the cross-section view, wherein the second groove portion extends in the depth direction of the semiconductor substrate and includes a second portion of the first insulating film,
wherein,
  a second insulating film is disposed over the first insulating film between the first and second photoelectric converters, and
  a depth of the first groove portion is deeper than a depth of the second groove portion in the cross-section view; and an optical lens configured to form an image on the solid-state imaging device.

* * * * *